(12) United States Patent
Nakatani et al.

(10) Patent No.: US 12,501,635 B2
(45) Date of Patent: Dec. 16, 2025

(54) SEMICONDUCTOR DEVICE

(71) Applicant: Mitsubishi Electric Corporation, Tokyo (JP)

(72) Inventors: Takahiro Nakatani, Tokyo (JP); Tetsuya Nitta, Tokyo (JP); Koichi Nishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 357 days.

(21) Appl. No.: 17/466,217

(22) Filed: Sep. 3, 2021

(65) Prior Publication Data
US 2022/0173231 A1 Jun. 2, 2022

(30) Foreign Application Priority Data
Nov. 27, 2020 (JP) ................................. 2020-196923

(51) Int. Cl.
*H10D 12/00* (2025.01)
*H10D 62/17* (2025.01)
*H10D 84/80* (2025.01)

(52) U.S. Cl.
CPC ......... *H10D 12/481* (2025.01); *H10D 62/177* (2025.01); *H10D 84/811* (2025.01)

(58) Field of Classification Search
None
See application file for complete search history.

(56) References Cited

U.S. PATENT DOCUMENTS

| | | | |
|---|---|---|---|
| 2008/0093697 A1 | 4/2008 | Kaneda et al. | |
| 2012/0292662 A1* | 11/2012 | Matsuura | H01L 29/1095 |
| | | | 257/E29.198 |
| 2013/0248882 A1* | 9/2013 | Ogura | H01L 29/66348 |
| | | | 257/140 |
| 2013/0328105 A1* | 12/2013 | Matsuura | H01L 29/0696 |
| | | | 438/138 |
| 2014/0048847 A1 | 2/2014 | Yamashita et al. | |
| 2014/0126091 A1* | 5/2014 | Gill | H01L 27/0259 |
| | | | 438/328 |

(Continued)

FOREIGN PATENT DOCUMENTS

| | | |
|---|---|---|
| CN | 103890955 A | 6/2014 |
| CN | 105378931 A | 3/2016 |

(Continued)

OTHER PUBLICATIONS

C.J. Palmstrøm, Contacts for Compound Semiconductors: Ohmic Type, Encyclopedia of Materials: Science and Technology, 2001, pp. 1581-1587 (Year: 2001).*

(Continued)

*Primary Examiner* — Jessica S Manno
*Assistant Examiner* — Christopher A. Schodde
(74) *Attorney, Agent, or Firm* — Studebaker Brackett PLLC

(57) ABSTRACT

A semiconductor device includes an insulated gate bipolar transistor region having a base layer of a second conductivity type provided in a surface layer of the semiconductor substrate on a first main surface side, an emitter layer of a first conductivity type having an impurity concentration higher than that of a drift layer selectively provided in the surface layer of the base layer on the first main surface side, a plurality of gate electrodes facing the emitter layer, the base layer, and the drift layer via gate insulating films, a counter-doped layer, having an impurity concentration of the second conductivity type higher than that of the base layer and an impurity concentration of the first conductivity type higher than that of the drift layer, and a collector layer of the second conductivity type provided in the surface layer of the semiconductor substrate on a second main surface side.

11 Claims, 18 Drawing Sheets

(56) References Cited

U.S. PATENT DOCUMENTS

| | | | | |
|---|---|---|---|---|
| 2015/0380536 | A1* | 12/2015 | Kimura | H01L 29/1095 257/144 |
| 2016/0071841 | A1* | 3/2016 | Saito | H01L 27/0727 257/140 |
| 2016/0268252 | A1* | 9/2016 | Saito | H01L 29/1095 |
| 2017/0098700 | A1 | 4/2017 | Yamashita et al. | |
| 2018/0019319 | A1* | 1/2018 | Baburske | H01L 29/66333 |
| 2018/0151711 | A1* | 5/2018 | Yamada | H01L 29/8613 |
| 2018/0366548 | A1 | 12/2018 | Naito | |
| 2018/0374947 | A1 | 12/2018 | Yamashita et al. | |
| 2021/0083081 | A1* | 3/2021 | Laven | H01L 21/26506 |

FOREIGN PATENT DOCUMENTS

| | | |
|---|---|---|
| DE | 112012003111 T5 | 4/2014 |
| DE | 112017000727 T5 | 10/2018 |
| JP | 2008-103590 A | 5/2008 |
| JP | 2013-048230 A | 3/2013 |

OTHER PUBLICATIONS

An Office Action mailed by the Japanese Patent Office on Oct. 24, 2023, which corresponds to Japanese Patent Application No. 2020-196923 and is related to U.S. Appl. No. 17/466,217.

Office Action issued in DE 10 2021 128 798.7; mailed by the German Patent and Trademark Office on Sep. 19, 2024.

An Office Action; mailed by the China National Intellectual Property Administration of the People's Republic of China on Nov. 29, 2024, which corresponds to Chinese Patent Application No. 202111403636.7 and is related to U.S. Appl. No. 17/466,217.

An Office Action; mailed by the China National Intellectual Property Administration of the People's Republic of China on May 29, 2025, which corresponds to Chinese Patent Application No. 202111403636.7 and is related to U.S. Appl. No. 17/466,217.

* cited by examiner

F I G. 3
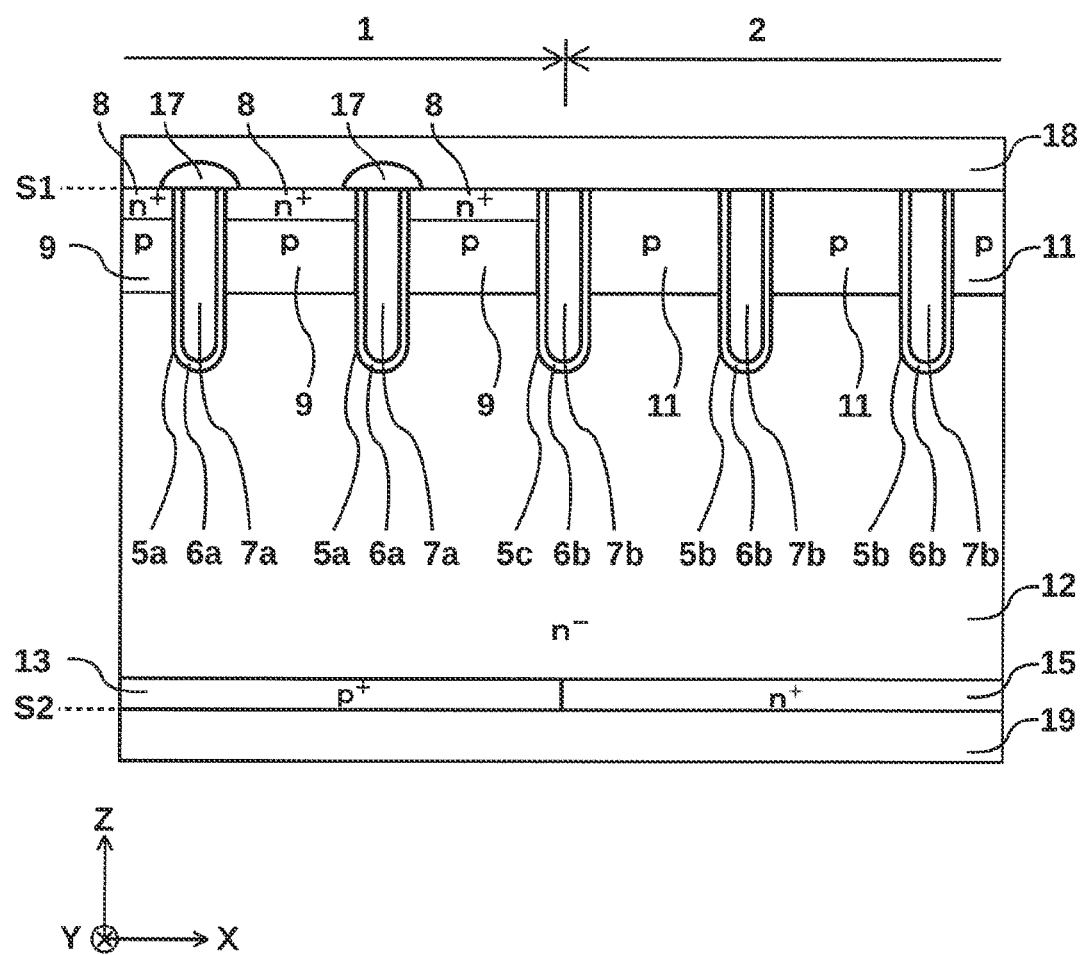

F I G. 1 2
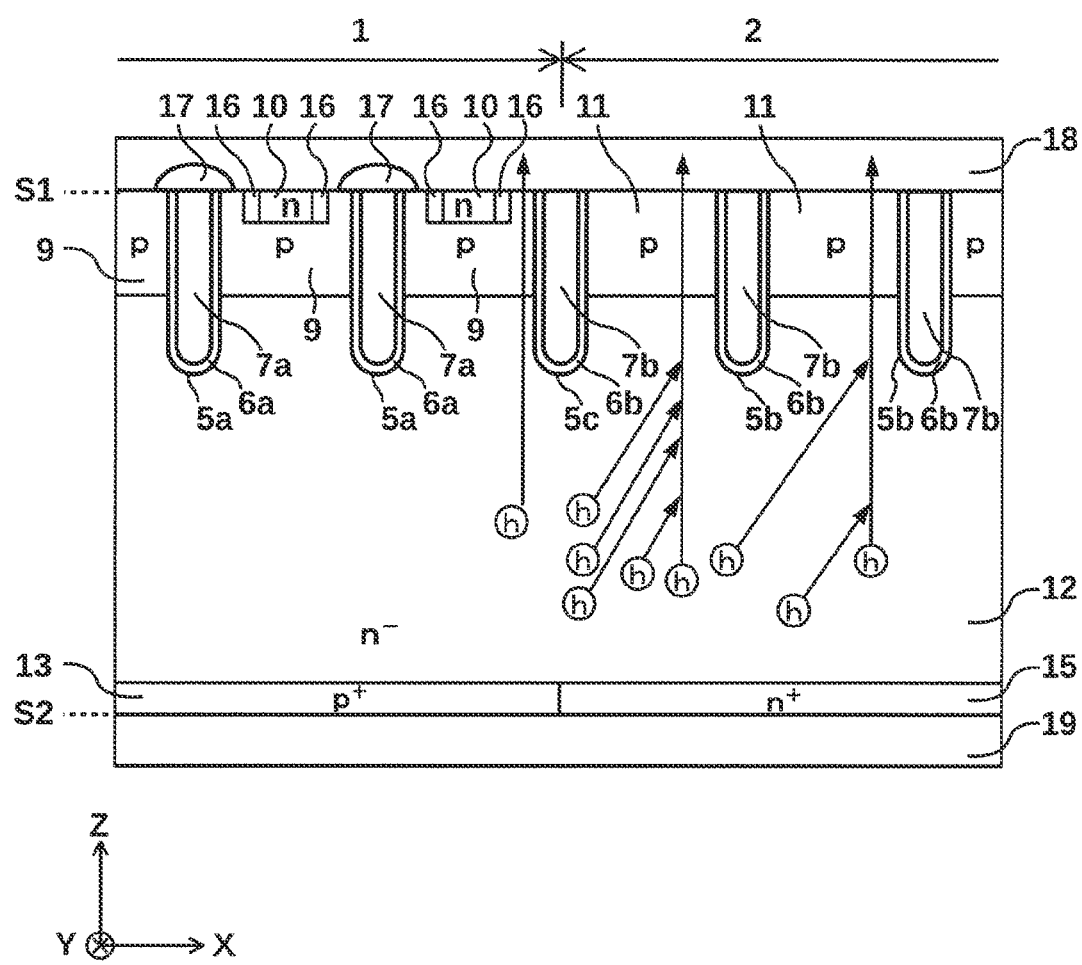

SEMICONDUCTOR DEVICE

BACKGROUND OF THE INVENTION

Field of the Invention

The present disclosure relates to a semiconductor device.

Description of the Background Art

From the viewpoint of energy saving, inverter devices are used in a wide range of fields such as home appliances, electric vehicles, and railways. Most inverter devices are configured by using an insulated gate bipolar transistor (IGBT) and a diode for reflux. The insulated gate bipolar transistor and the diode are connected by wiring such as a wire inside the inverter device.

In order to reduce the size of the inverter device, a semiconductor device in which an insulated gate bipolar transistor and a diode are formed on one semiconductor substrate has been proposed (for example, Japanese Patent Application Laid-Open No. 2008-103590).

SUMMARY

However, in a semiconductor device in which an insulated gate bipolar transistor and a diode are formed on one semiconductor substrate as described above, there has been a problem in that, the recovery current during recovery operation becomes larger than when the insulated gate bipolar transistor and the diode, which are individual components, are connected in parallel, because holes, which are a small number of carriers, flow from the insulated gate bipolar transistor to the diode region, leading to the reduction in fracture resistance of the diode. There is a demand for a semiconductor device having a diode region having a high fracture resistance during recovery operation.

An object of the present disclosure is to provide a semiconductor device having an improved fracture resistance during recovery operation.

The semiconductor device according to the present disclosure includes a semiconductor substrate, a diode region, and an insulated gate bipolar transistor region. The semiconductor substrate has a drift layer of a first conductivity type between a first main surface and a second main surface side opposite to the first main surface. The diode region has an anode layer of a second conductivity type and a cathode layer of the first conductivity type. The anode layer of the second conductivity type is provided in a surface layer of the semiconductor substrate on the first main surface side. The cathode layer of the first conductivity type is provided in a surface layer of the semiconductor substrate on the second main surface side. The insulated gate bipolar transistor region is arranged in line with the diode region in a first direction along the first main surface of the semiconductor substrate. The insulated gate bipolar transistor region has a base layer of the second conductivity type, an emitter layer of the first conductivity type, gate electrodes, a counter-doped layer, and a collector layer of the second conductivity type. The base layer of the second conductivity type is provided in the surface layer of the semiconductor substrate on the first main surface side. The emitter layer of the first conductivity type has an impurity concentration higher than that of a selectively provided in the surface layer of the base layer on the first main surface side. A plurality of gate electrodes are provided side by side in the first direction and facing the emitter layer, the base layer, and the drift layer via gate insulating films. The counter-doped layer is provided in the surface layer of the base layer, has an impurity concentration of the second conductivity type higher than that of the base layer and an impurity concentration of the first conductivity type higher than that of the drift layer. The collector layer of the second conductivity type is provided in the surface layer of the semiconductor substrate on the second main surface side.

Provision of the counter-doped layer in the insulated gate bipolar transistor region suppresses the holes from flowing into the diode region and ensures improvement in the fracture resistance during the recovery operation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a cross-sectional view illustrating the semiconductor device according to Embodiment 1;

FIG. 12 is a schematic diagram illustrating the movement of holes during recovery operation of the semiconductor device according to Embodiment 1;

DESCRIPTION OF THE PREFERRED EMBODIMENTS

Figure 1:
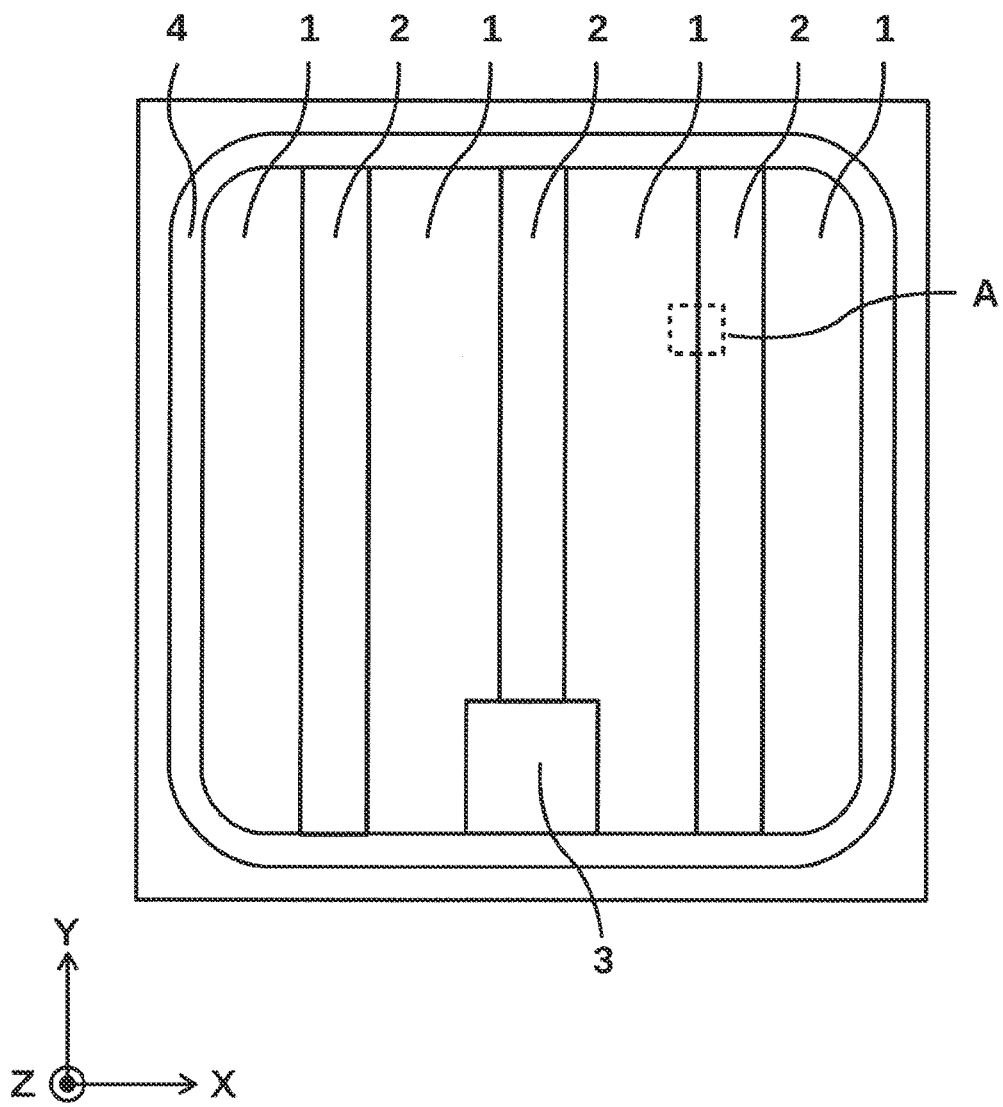
FIG. 1 is a plan view illustrating a semiconductor device according to Embodiment 1.

Hereinafter, Embodiments will be described with reference to the drawings. The drawings are schematically illustrated; therefore, the interrelationships of size and position of components are subject to change. In the following description, the same or corresponding components may be given the same reference numerals and repeated descriptions may be omitted.

Also although in the description described below, when terms specifying specific positions and directions such as "up", "low", "left", "right", "side" and the like are used, these terms are used for convenience to facilitate understanding of the contents of Embodiment, and the positions and the directions in actual implementation are not limited thereby.

Regarding the conductivity type of the semiconductor, n-type represents the first conductive type and p-type represents the second conductivity type in the description. However, in a reversed manner, p-type may represent the first conductivity type and n-type may represent the second conductivity type. $n^+$-type means that the donor concentration is higher than that of n-type, and $n^-$-type means that the donor concentration is lower than that of n-type. Similarly, $p^+$-type means that the acceptor concentration is higher than that of p-type, and $p^-$-type means that the acceptor concentration is lower than that of p-type.

Embodiment 1

Figure 2:
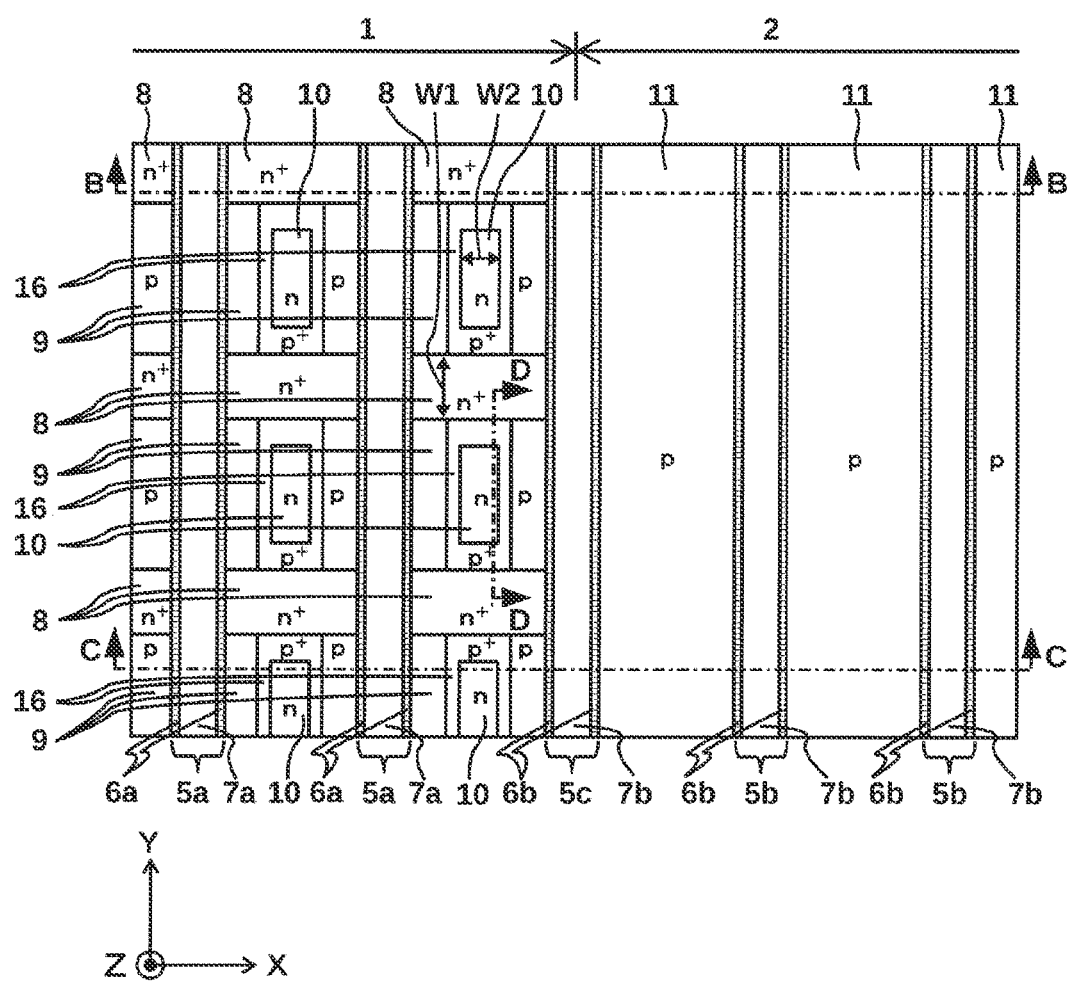
FIG. 2 is a plan view illustrating the semiconductor device according to Embodiment 1.
Figure 4:
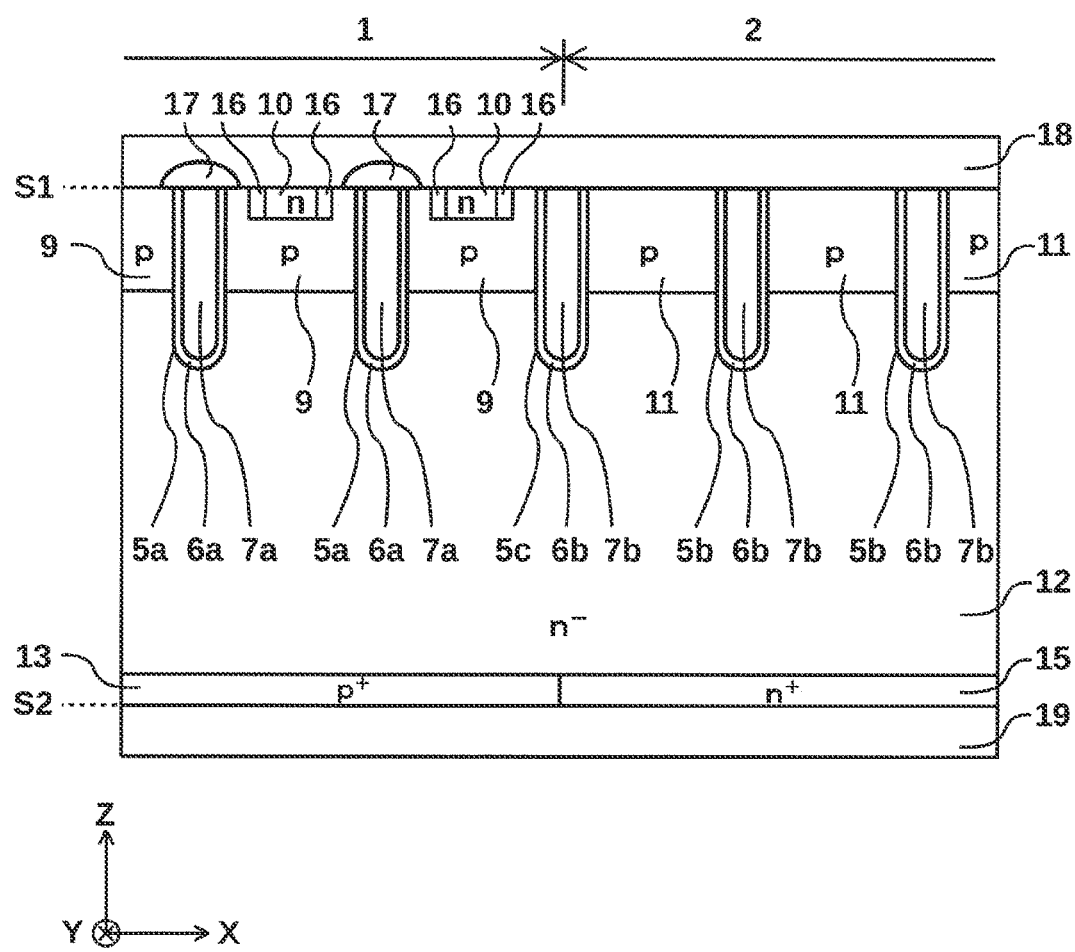
FIG. 4 is a cross-sectional view illustrating the semiconductor device according to Embodiment 1.
Figure 5:
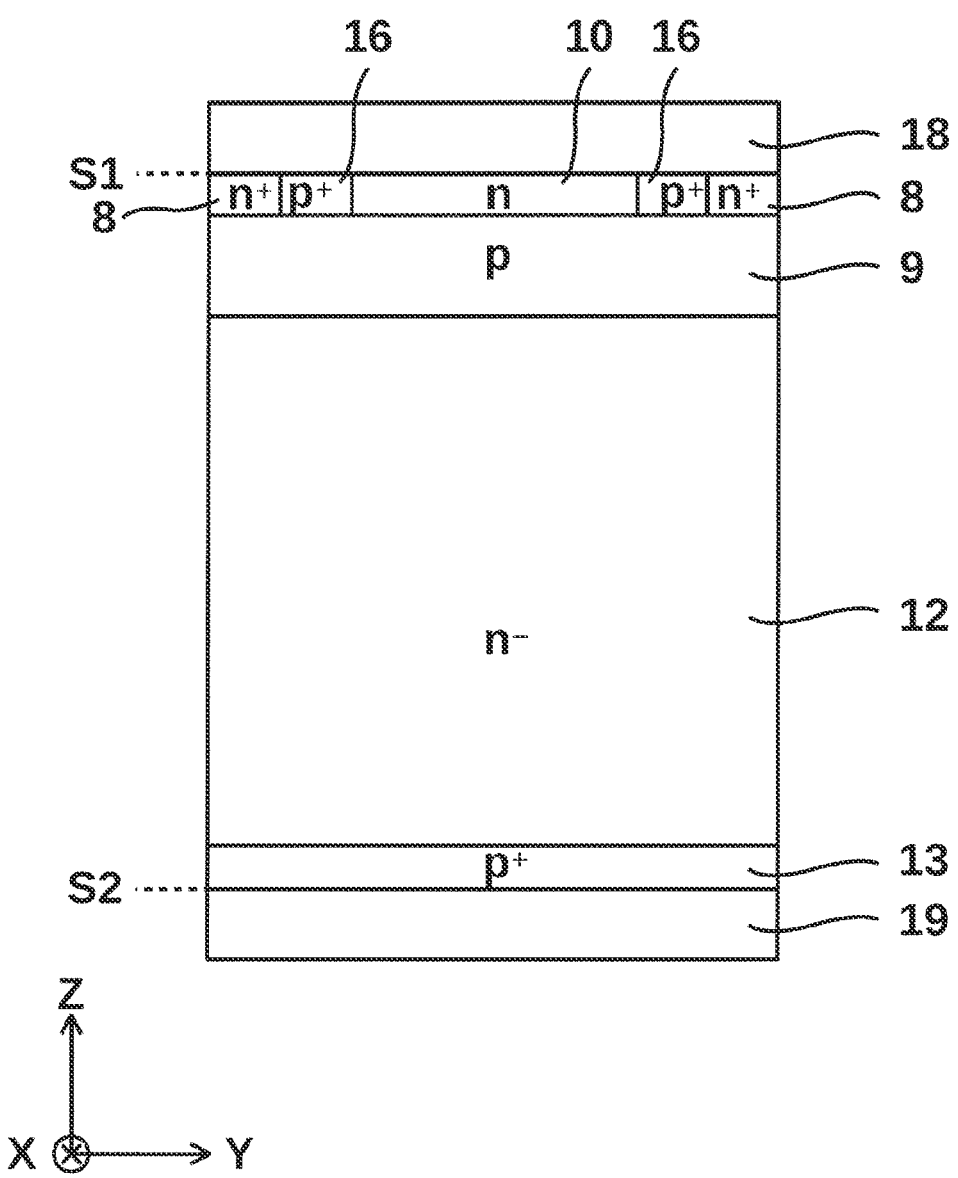
FIG. 5 is a cross-sectional view illustrating the semiconductor device according to Embodiment 1.

The configuration of the semiconductor device according to Embodiment 1 will be described with reference to FIGS. 1 to 5. FIGS. 1 and 2 are a plan views illustrating a semiconductor device according to Embodiment 1. FIG. 2 is an enlarged plan view of part A illustrated in FIG. 1, and is a plan view illustrating the structure of a semiconductor substrate on a first main surface side. In FIG. 2, the depiction of electrodes and the like provided above the first main surface of the semiconductor substrate is omitted. FIGS. 3 to 5 are cross-sectional views of the semiconductor device according to Embodiment 1. FIG. 3 is a cross-sectional view taken along the line B-B illustrated in FIG. 2. FIG. 4 is a cross-sectional view taken along the line C-C illustrated in FIG. 2. FIG. 5 is a cross-sectional view taken along the line D-D illustrated in FIG. 2. For convenience of description, the XYZ orthogonal coordinate axes indicating directions is also illustrated in FIGS. 1 to 5.

As illustrated in FIG. 1, in a semiconductor device 100, insulated gate bipolar transistor regions 1 in which an insulated gate bipolar transistor is formed and a diode regions 2 in which a diode is formed are provided adjacent to each other on one semiconductor substrate. The insulated gate type bipolar transistor regions 1 and the diode regions 2 are striped regions having a longitudinal direction in the Y direction of the semiconductor device 100, and the insulated gate type bipolar transistor regions 1 and the diode regions 2 are provided side by side in the X direction of the semiconductor device 100. The insulated gate bipolar transistor regions 1 and the diode regions 2 are active regions of the semiconductor device 100, and the insulated gate bipolar transistor regions 1 and the diode regions 2 are arranged in the center of the semiconductor device 100 in plan view.

The semiconductor device 100 is provided with a gate signal reception region 3. The gate signal reception region 3 is a region for receiving an electric signal from the outside. The insulated gate bipolar transistor region 1 switches between an energized state and a non-energized state in response to the electric signal received in the gate signal receiving region 3. The gate signal reception region 3 is arranged in the vicinity of the insulated gate bipolar transistor regions 1. By arranging the gate signal reception region 3 in the vicinity of the insulated gate bipolar transistor regions 1, noise is suppressed from being mixed in the electric signal and malfunction of the insulated gate bipolar transistor regions 1 is prevented. Wiring for receiving an electric signal from the outside is connected to the gate signal reception region 3. For wiring, for example, a wire, a lead wire, or the like may be used.

In FIG. 1, the gate signal reception region 3 is rectangular, and although three sides thereof are arranged adjacent to the insulated gate bipolar transistor regions 1 and the diode region 2, the arrangement of the gate signal reception region 3 is not limited thereto. The gate signal reception region 3 need only be arranged in the vicinity of an insulated gate bipolar transistor region 1 and a diode region 2, which are active regions. The gate signal reception region 3 may also be arranged in a center of the active region such that all the four sides thereof are arranged adjacent to an insulated gate bipolar transistor region 1 and a diode region 2, or may also be arranged at a corner of the active region such that two out of four sides thereof are arranged adjacent to an insulated gate bipolar transistor region 1 and a diode region 2. Further, the arrangement of the gate signal reception region 3 is not limited thereto, and the gate signal receiving area 3 need only be arranged in the region surrounded by a terminal region 4 surrounding the active region in plan view, and the shape of the gate signal reception region 3 is not necessarily rectangular.

In plan view, the terminal region 4 is provided so as to surround the insulated gate type bipolar transistor regions 1, the diode regions 2, and the gate signal reception region 3. In order to maintain the withstand voltage of the semiconductor device 100, the termination region 4 is provided with a withstand voltage holding structure such as Field Limiting Ring (FLR) or REduced SURface Field (RESURF).

As illustrated in FIG. 2, a plurality of trenches 5a are provided on the surface side of the insulated gate bipolar transistor region 1, and one trench 5c is provided at the boundary between the insulated gate bipolar transistor region 1 and the diode region 2, and a plurality of trenches 5b are provided on the surface side of the diode region 2. The trenches 5a, 5b, and 5c are grooves formed on the first main surface side of the semiconductor substrate by etching technology or the like. A plurality of trenches 5a, 5b, and 5c are arranged side by side in the X direction, which is the first direction, and have a longitudinal direction in the Y direction, which is the second direction orthogonal to the first direction. A gate insulating film 6a is provided on the side wall of a trench 5a. A gate insulating film 6b is provided on the side wall of a trench 5b and the trench 5c. A conductive gate electrode 7a is provided inside a gate insulating film 6a of a trench 5a, and a conductive gate electrode 7b is provided inside the gate insulating films 6b of a trench 5b and a trench 5c. The gate electrodes 7a and the gate electrodes 7b have a longitudinal direction in the Y direction, and a plurality of the gate electrodes 7a and the gate electrode 7b are provided side by side in the X direction.

In the surface layer of the semiconductor substrate between the adjacent trenches 5a and in the surface layer of the semiconductor substrate between the adjacent trenches 5a and 5c in the insulated gate bipolar transistor region 1, an n-type emitter layer 8 in which a donor concentration is higher than a donor concentration of the drift layer (not illustrated in FIG. 2), a p-type base layer containing acceptor atoms, a p-type base contact layer 16 having an acceptor concentration higher than the acceptor concentration of the base layer 9, and a counter-doped layer 10 having a donor concentration higher than that of the drift layer and having an acceptor concentration higher than that of the drift layer 9 are provided. The counter-doped layer 10 is a semiconductor layer having both a high concentration of donors and a high concentration of acceptor atoms. In the counter-doped layer 10, the donor concentration is higher than the acceptor concentration in the surface layer of the semiconductor substrate. The net doping concentration is equivalent to an n-type semiconductor layer. The net doping concentration is the concentration obtained by comparing the donor concentration and the acceptor concentration and subtracting the concentration on the low concentration side from the concentration on the high concentration side when both the donors and the acceptor atoms are present. The conductivity thereof becomes n-type when donors are higher in concentration, and becomes p-type when acceptor atoms are higher in the concentration.

The emitter layer 8 is in contact with the gate insulating film 6a in the X direction. Meanwhile, the counter-doped layer 10 is interposed between the base layers 9 between the adjacent gate electrodes 7a and between the adjacent gate electrodes 7a and 7b in the X direction, and is also interposed between the base contact layers 16; therefore, the counter-doped layer 10 is not in contact with the gate insulating films 6a. The emitter layer 8 has a longitudinal direction in the X direction and a lateral direction in the Y direction. The counter-doped layer 10 has a longitudinal direction in the Y direction and a lateral direction in the X direction. Further, the counter-doped layer 10 is arranged so as to be interposed between the emitter layers 8 in the Y direction.

In plan view, the width of the counter-doped layer 10 in the lateral direction, that is, the width W2 of the counter-doped layer 10 in the X direction is desirably equal to or less than the width of the emitter layer 8 in the lateral direction, that is, the width W1 of the emitter layer 8 in the Y direction. The provision of the counter-doped layer 10 raises concerns that a latch-up may occur directly under the counter-doped layer 10, reducing the current cutoff capacity when the insulated gate bipolar transistor region 1 switches from the energized state to the non-energized state, however, when the width of each of the counter-doped layer 10 and the emitter layer 8 in the lateral direction is set to the width satisfying the above relationship, the risk of occurring latch-up directly under the counter-doped layer 10 can be suppressed to be equal to or less than the level of the risk of occurring latch-up directly under the emitter layer 8.

A p-type anode layer 11 is provided in the surface layer of the semiconductor substrate between the adjacent trenches 5c and 5b and the surface layer of the semiconductor substrate between the adjacent trenches 5b in the diode region 2.

As illustrated in FIG. 3, the insulated gate bipolar transistor region 1 and the diode region 2 are provided on a common semiconductor substrate. The semiconductor substrate is, for example, a substrate made of silicon. The semiconductor substrate has a first main surface S1 on the positive side in the Z direction, and has a second main surface S2 opposite to the first main surface on the negative side in the Z direction with respect to the first main surface S1. The X and Y directions are directions extending along the first main surface S1, and the Z direction is a direction orthogonal to the first main surface S1. The semiconductor substrate has a drift layer 12 between the first main surface S1 and the second main surface S2. The drift layer 12 is provided across both the insulated gate type bipolar transistor region 1 and the diode region 2. The drift layer 12 is a semiconductor layer having, for example, arsenic or phosphorus as donors thereof, and the donor concentration thereof is $1.0E+12/cm^3$ to $1.0E+16/cm^3$.

In the insulated gate bipolar transistor region 1, the base layer 9 is provided on the first main surface S1 side of the semiconductor substrate. The emitter layer 8 is provided in the surface layer of the base layer 9. The emitter layer 8 is a semiconductor layer having, for example, arsenic or phosphorus as donors thereof, and the donor concentration thereof is $1.0E+17/cm^3$ to $1.0E+20/cm^3$. The base layer 9 is a semiconductor layer having, for example, boron, aluminum or the like as acceptor atoms thereof, and the acceptor concentration thereof is $1.0E+15/cm^3$ to $1.0E+18/cm^3$.

The trenches 5a are provided on the first main surface S1 side of the insulated gate bipolar transistor region 1 so as to extend the emitter layer 8 and the base layer 9 and reach the drift layer 12. The gate electrode 7a faces the emitter layer 8, the base layer 9, and the drift layer 12 via the gate insulating film 6a. A first electrode 18 is provided on the positive side of the gate electrode 7a in the Z direction via an interlayer insulating film 17. The gate electrode 7a is electrically insulated from the first electrode 18 by the interlayer insulating film 17. The gate electrode 7a is electrically connected to the gate signal reception region 3 illustrated in FIG. 1, receives an electric signal via the gate signal reception region 3, and is controlled so as to make the voltage thereof rise and fall in response. to the electric signal. The gate electrode 7a is an electrode that is also referred to as, so-called, an active gate electrode or the like.

When a positive voltage is applied to the gate electrode 7a, an n-type channel (not illustrated) is formed at a position in contact with the gate insulating film 6a of the base layer 9. The emitter layer 8 is in contact with the gate insulating film 6a; therefore, the emitter layer 8 and the drift layer 12 are connected by the n-type channel, and the insulated gate bipolar transistor region 1 is switched to the energized state. When a positive voltage is not applied to the gate electrode 7a, no n-type channel is formed in the base layer 9, so that the insulated gate bipolar transistor region 1 is switched to the non-energized state. The gate electrode 7a and the gate signal reception region 3 are electrically connected by wiring (not illustrated) with aluminum or the like on the first main surface S1 side in another cross section.

The first electrode 18 is consisted of, for example, aluminum or an aluminum alloy. The first electrode 18 is provided on the positive side in the Z direction of the emitter layer 8 and is electrically connected to the emitter layer 8. Aluminum and an aluminum alloy are metals having low contact resistance with the p-type semiconductor layer and high contact resistance with the n-type semiconductor layer. Therefore, when the first electrode 18 is consisted of aluminum or an aluminum alloy, titanium, which has low contact resistance with the n-type semiconductor layer, may be in contact with the emitter layer 8, without directly connecting the first electrode 18 to the n-type emitter layer 8, to electrically connect the emitter layer 8 and the first electrode 18 via titanium.

In the insulated gate bipolar transistor region 1, a p-type collector layer 13 having an acceptor concentration higher than that of the base layer 9 is provided on the second main surface S2 side of the semiconductor substrate. The collector layer 13 is a semiconductor layer having, for example, boron, aluminum or the like as acceptor atoms thereof, and the acceptor concentration thereof is $1.0E+16/cm^3$ to $1.0E+20/cm^3$. A second electrode 19 is provided on the negative side of the collector layer 13 in the Z direction, and the collector layer 13 and the second electrode 19 are electrically connected.

In the diode region 2, an anode layer 11 is provided on the first main surface S1 side of the semiconductor substrate. The anode layer 11 is a semiconductor layer having, for example, boron, aluminum or the like as acceptor atoms thereof, and the acceptor concentration thereof is $1.0E+15/cm^3$ to $1.0E+18/cm^3$.

The trenches 5b are provided on the first main surface S1 side of the diode region 2. The trenches 5b are provided so as to extend the anode layer 11 and reach the drift layer 12. The gate electrode 7b faces the anode layer 11 and the drift layer 12 via the gate insulating film 6b. The first electrode 18 is provided on the positive side of the gate electrode 7b in the Z direction. The gate electrode 7b and the first electrode 18 are electrically connected. Unlike the gate electrode 7a, the voltage of the gate electrode 7b does not rise and fall by the gate signal reception region 3. The first electrode 18 is provided on the positive side in the Z direction of the anode layer 11 and is electrically connected to the anode layer 11. The gate electrode 7b is an electrode that is also referred to as, so-called, a dummy gate electrode or the like.

In the diode region 2, an n-type cathode layer 15 having a donor concentration higher than that of the drift layer 12 is provided on the second main surface S2 side of the semiconductor substrate. The cathode layer 15 is a semiconductor layer having, for example, arsenic or phosphorus as donors thereof, and the donor concentration thereof is $1.0E+16/cm^3$ to $1.0E+20/cm^3$. The second electrode 19 is provided on the negative side of the cathode layer 15 in the Z direction. The second electrode 19 is electrically connected to the cathode layer 15.

The trench 5c is provided on the first main surface S1 side of the boundary between the insulated gate bipolar transistor region 1 and the diode region 2. The trench 5c is provided so as to extend the anode layer 11 and the base layer 9 and reach the drift layer 12. The gate electrode 7b faces the emitter layer 8, the base layer 9, and the drift layer 12 via the gate insulating film 6b. The first electrode 18 is provided on the positive side of the gate electrode 7b in the Z direction, and the gate electrode 7b and the first electrode 18 are electrically connected.

As illustrated in FIG. 4, in the insulated gate bipolar transistor region 1, the counter-doped layer 10 and the base contact layer 16 are provided in the surface layer of the base layer 9. The counter-doped layer 10 is a semiconductor layer having, for example, arsenic or phosphorus as donors thereof, and the donor concentration thereof is $1.0E+17/cm^3$ to $1.0E+20/cm^3$. The counter-doped layer 10 is a semiconductor layer having, for example, boron, aluminum or the like as acceptor atoms thereof, and the acceptor concentration thereof is $1.0E+15/cm^3$ to $1.0E+20/cm^3$. The base contact layer 16 is a semiconductor layer having, for example, boron, aluminum or the like as acceptor atoms thereof, and the acceptor concentration thereof is $1.0E+15/cm^3$ to $1.0E+20/cm^3$.

The counter-doped layer 10 is arranged interposed between the base layers 9 between the adjacent gate electrodes 7a and between the adjacent gate electrodes 7a and 7b in the X direction, and is not in contact with the gate insulating films 6a. Therefore, even if a positive voltage is applied to the gate electrode 7a, the counter-doped layer 10 and the drift layer 12 are not connected by the n-type channel. That is, the counter-doped layer 10 is a semiconductor layer that is not involved in switching between the energized state and the non-energized state of the insulated gate bipolar transistor region 1.

As illustrated in FIG. 5, in the insulated gate bipolar transistor region 1, the emitter layer 8, the counter-doped layer 10 and the base contact layer 16 are selectively provided in the surface layer of the base layer 9, respectively.

Figure 6:
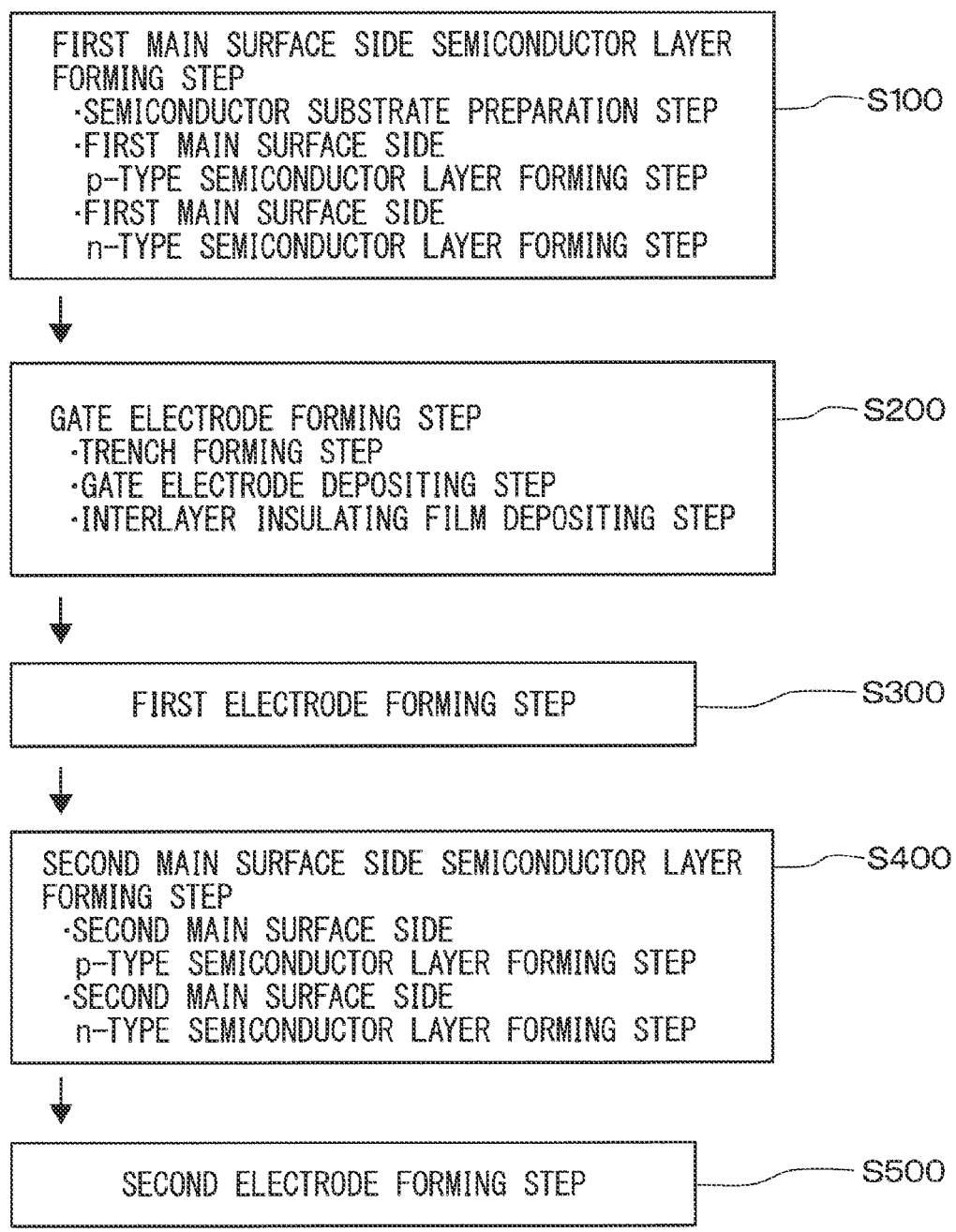
FIG. 6 is a flowchart for manufacturing the semiconductor device according to Embodiment 1.

Next, a manufacturing method of the semiconductor device according to Embodiment 1 will be described. FIG. 6 is a flowchart for manufacturing the semiconductor device according to Embodiment 1. The manufacturing method will be described following the order of the manufacturing flowchart. The manufacturing method of the active region is described in the following description of the manufacturing method, and the manufacturing method of the terminal region 4 and the gate signal reception region 3 formed in an arbitrary structure is omitted.

As illustrated in FIG. 6, the semiconductor device according to Embodiment 1 is produced through a first main surface side semiconductor layer forming step (S100), a gate electrode forming step (S200), a first electrode forming step (S300), a second main surface side semiconductor layer forming step (S400), and a second electrode forming step (S500). The first main surface side semiconductor layer forming step (S100) is divided into a semiconductor substrate preparation step, a first main surface side p-type semiconductor layer forming step, and a first main surface side n-type semiconductor layer forming step. The gate electrode forming step (S200) is divided into a trench forming step, a gate electrode depositing step, and an interlayer insulating film depositing step. The second main surface side semiconductor layer forming step (S400) is divided into a second main surface side p-type semiconductor layer forming step, and a second main surface side n-type semiconductor layer forming step.

FIGS. 7A to 10B are diagrams illustrating the manufacturing processes of the semiconductor device according to Embodiment 1. FIGS. 7A to 10B are cross-sectional views taken along the line C-C illustrated in FIG. 2.

Figure 7A:
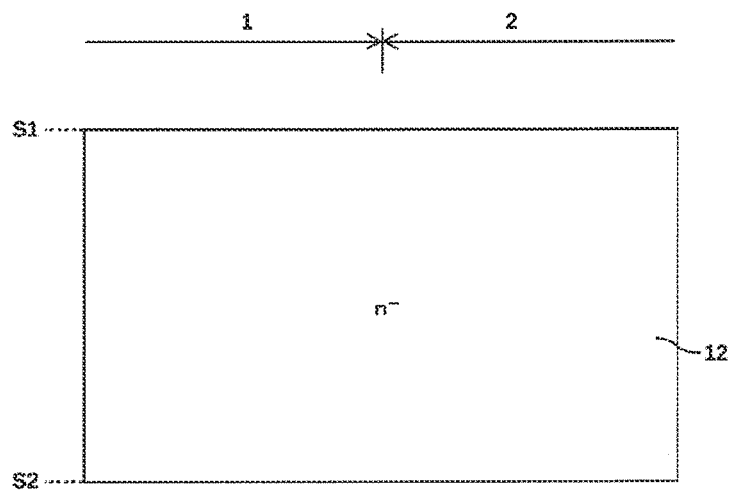
FIGS. 7A to 7C are diagrams illustrating manufacturing processes for the semiconductor device according to Embodiment 1.
Figure 7B:
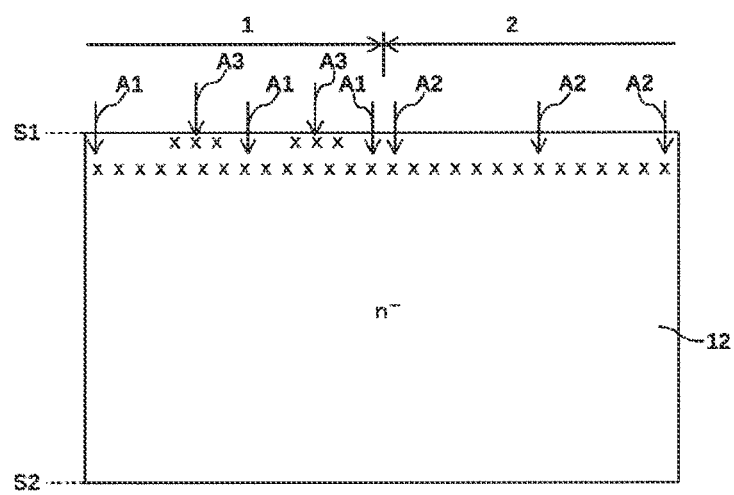
Figure 7C:
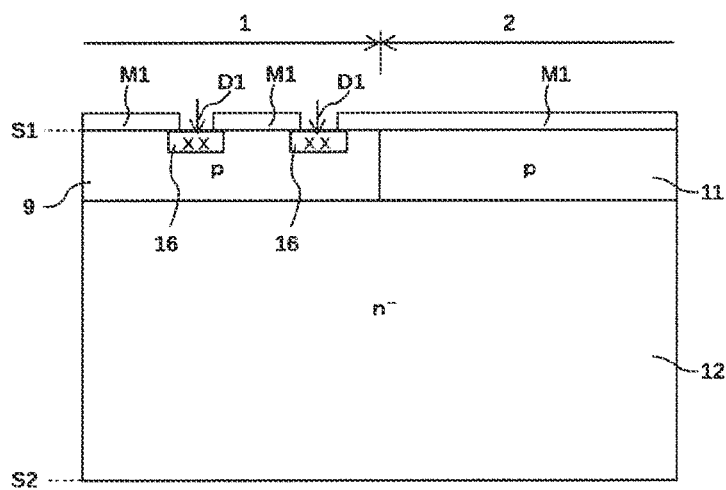

FIGS. 7A to 7C are diagrams illustrating the manufacturing processes of the first main surface side semiconductor layer forming step. FIG. 7A is a diagram illustrating a state in which the semiconductor substrate preparation step is completed. The semiconductor substrate preparation step is a step of preparing an n-type semiconductor substrate having a low donor concentration. The donor concentration of the drift layer 12 represents the donor concentration of the semiconductor substrate per se, the semiconductor substrate is prepared in accordance with the donor concentration of the drift layer 12. When the semiconductor substrate preparation step is completed, the insulated gate bipolar transistor region 1 and the diode region 2 have only the drift layer 12.

FIG. 7B is a diagram illustrating a manufacturing process of the first main surface side p-type semiconductor layer forming step. The first main surface side p-type semiconductor layer forming step is a step of forming the base layer 9, the base contact layer 16, and the anode layer 11. The base layer 9 is formed by implanting acceptor atoms A1 into the insulated gate bipolar transistor region 1 from the first main surface S1 side. The base contact layer 16 is formed by implanting acceptor atoms A3 into the insulated gate bipolar transistor region 1 from the first main surface S1 side. The anode layer 11 is formed by implanting acceptor atoms A2 into the diode region 2 from the first main surface S1 side. As the acceptor atoms A1, the acceptor atoms A2, and the acceptor atoms A3, for example, boron, aluminum or the like is used. The acceptor atoms A1, the acceptor atoms A2, and the acceptor atoms A3 can be the same, and when the acceptor atoms A1, the acceptor atoms A2, and the acceptor atoms A3 are the same, the switching of acceptor atoms is eliminated.

When the one ingredient is used for the acceptor atoms A1 and the acceptor atoms A2, and the same implanting amount is set for the acceptor atoms A1 and the acceptor atoms A2, the simultaneous implantation for the acceptor atoms A1 and the acceptor atoms A2 is performable. The acceptor atoms A3 are selectively implanted. For the selective implantation, the acceptor atoms A3 need only be implanted in a state where a mask is arranged that hampers implantation to places where no implantation is required. For example, a resist mask may be used as the mask. Even when the acceptor atoms A1 and the acceptor atoms A2 are implanted separately, they may be selectively implanted using the mask. The implanted acceptor atoms A1, acceptor atoms A2, and acceptor atoms A3 are diffused by heating to form the base layer 9, the anode layer 11, and the base contact layer 16.

FIG. 7C is a diagram illustrating a manufacturing process of the first main surface side n-type semiconductor layer forming step. The first main surface side n-type semiconductor layer forming step is a step of forming the counter-doped layer 10. The counter-doped layer 10 is formed by implanting donors A1 into the base contact layer 16 in the insulated gate bipolar transistor region 1 from the first main surface S1 side. As the donors D1, arsenic, phosphorus or the like is used.

The counter-doped layer 10 is formed by selectively implanting the donors D1 into the base contact layer 16. That is, the base contact layer 16 and the counter-doped layer 10 have the same acceptor atoms, and the region into which the donors D1 are implanted in the base contact layer 16 ultimately becomes the counter-doped layer 10, and the region into which the donors D1 are not implanted ultimately becomes the base contact layer 16.

In order to selectively form the counter-doped layer 10, the donors D1 may be selectively implanted using a first main surface side donor implantation mask M1. The first main surface side donor implantation mask M1 is, for example, a resist mask formed by applying a resist on the first main surface S1 to prevent the permeation of donors. The first main surface side donor implantation mask M1 is provided at places where the donors D1 are not implanted, and is removed after the donors D1 are implanted.

The implanted donors D1 are diffused by heating to form the counter-doped layer 10. Although, the base layer 9, the anode layer 11, the base contact layer 16, and the counter-doped layer 10 are formed by implanting and diffusing the acceptor atoms A1, the acceptor atoms A2, and the acceptor atoms A3 and then implanting and diffusing the donors D1, the formation method of each semiconductor layer is not limited thereto. For example, the donors D1 may be implanted and then the acceptor atoms A1, the acceptor atoms A2, and the acceptor atoms A3 may be implanted and diffused, or the donors D1 may be implanted after the acceptor atoms A1 and the acceptor atoms A2 may be implanted, and the acceptor atoms A3 may be implanted, and then the simultaneous heating may be performed to diffuse them. The heating after the implantation may be performed individually after each implantation, or may be performed simultaneously after implanting a plurality of types of acceptor atoms and the donors.

In the first main surface side semiconductor layer forming step, the emitter layer 8 illustrated in FIG. 5 is formed in a cross section different from the cross section illustrated in FIGS. 7A to 7C. The emitter layer 8 is formed by selectively implanting donors into the surface layer of the base layer 9, similarly to the counter-doped layer 10. When the donors used for forming the emitter layer 8 and the donors D1 used for forming the counter-doped layer 10 are the same and the donor concentrations thereof are further the same, the emitter the simultaneous donor implantation of the emitter layer 8 and the counter-doped layer 10 is performable, which simplifies the manufacturing process.

When different donors are used for the emitter layer 8 and the counter-doped layer 10, or different donor concentrations are desired to be set, the implantation of the donors for the emitter layer 8 and the implantation of the donors D1 of the counter-doped layer 10 may be performed separately. In that case, the first main surface side donor implantation mask may be formed twice, and the donors may be selectively implanted into the portion corresponding to each semiconductor layer.

Figure 8A:
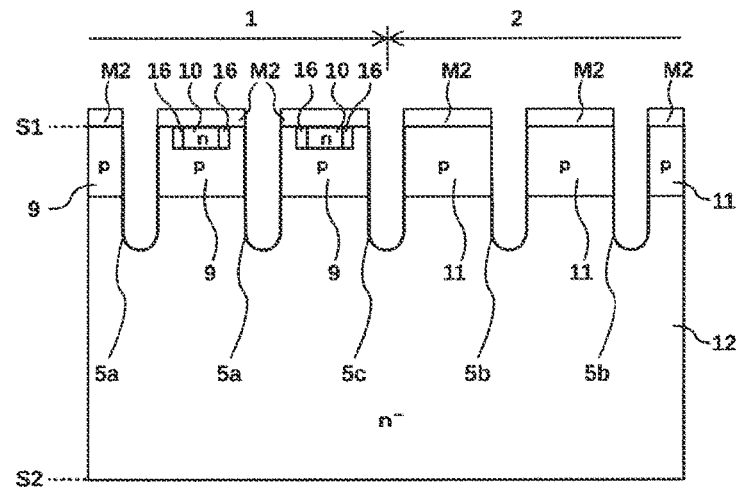
FIGS. 8A to 8C are diagrams illustrating manufacturing processes for the semiconductor device according to Embodiment 1.
Figure 8B:
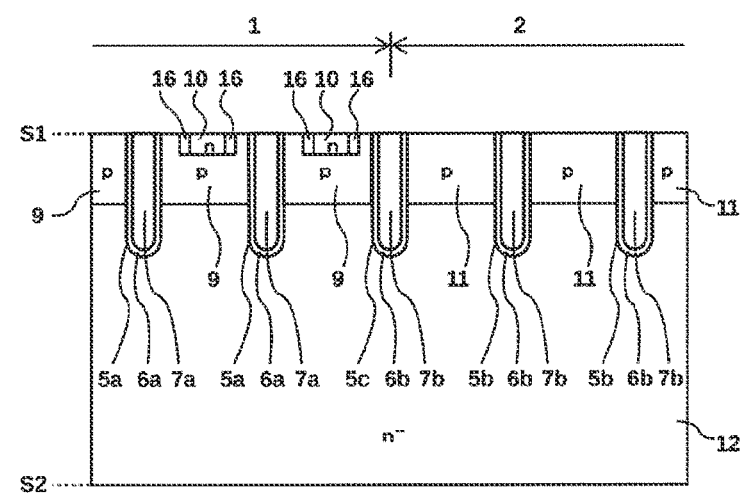
Figure 8C:
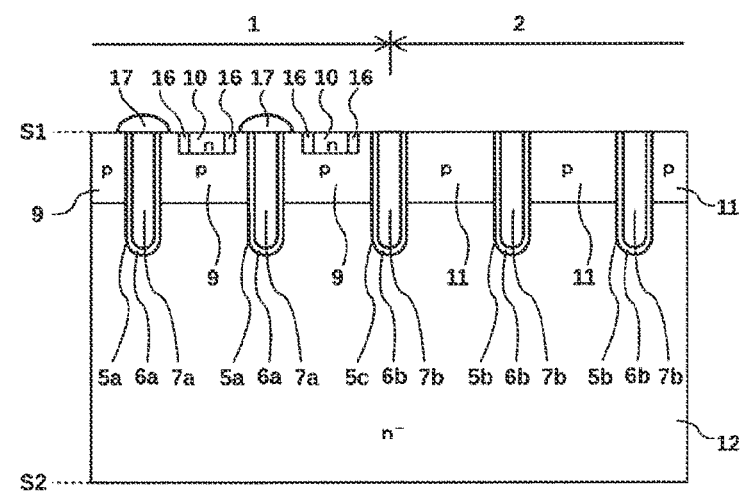

FIGS. 8A to 8C are diagrams illustrating the manufacturing processes of the gate electrode forming step.

FIG. 8A is a diagram illustrating a manufacturing process of the trench forming step. The trench forming step is a step of forming trenches 5a, 5b, and 5c on the first main surface S1 side by etching. A trench mask M2 is formed in advance in places where trenches 5a, 5b, and 5c are not formed before etching. The trench mask M2 is, for example, a mask made of an oxide film formed by heating on the first main surface S1, and is to be removed after the trench is formed.

FIG. 8B is a diagram illustrating a manufacturing process of the gate electrode depositing step. The gate electrode depositing step is a step of depositing the gate electrodes 7a in the trenches 5a and depositing the gate electrodes 7b in the trench 5b and the trench 5c. First, an oxide film is formed on the front surface of the semiconductor substrate including the side walls of the trenches 5a, 5b, and 5c by heating. After forming the oxide film, the gate electrodes 7a and the gate electrodes 7b are deposited from the first main surface S1 side. The gate electrodes 7a and the gate electrodes 7b are formed by depositing the same conductive material. The gate electrodes 7a and the gate electrodes 7b are formed by depositing, for example, polysilicon. After the polysilicon is deposited on the entire surface on the first main surface S1, unnecessary polysilicon is removed by etching. The polysilicon left inside the trenches 5a become the gate electrodes 7a, and the polysilicon left inside the trenches 5b and the trench 5c become the gate electrodes 7b. Further, the oxide films left inside the trenches 5a after the unnecessary oxide film is removed become the gate insulating film 6a, and the oxide films left inside the trenches 5b and the trench 5c become the gate insulating films 6b.

FIG. 8C is a diagram illustrating a state in which the interlayer insulating film depositing step is completed. The interlayer insulating film forming step is a step of forming the interlayer insulating films 17 which are insulator on the gate electrodes 7a. The interlayer insulating films 17 are, for example, oxide films formed by a Chemical Vapor Deposition (CVD) method. The oxide film formed on the first main surface S1 other than the gate electrodes 7a is removed by, for example, etching.

Figure 9:
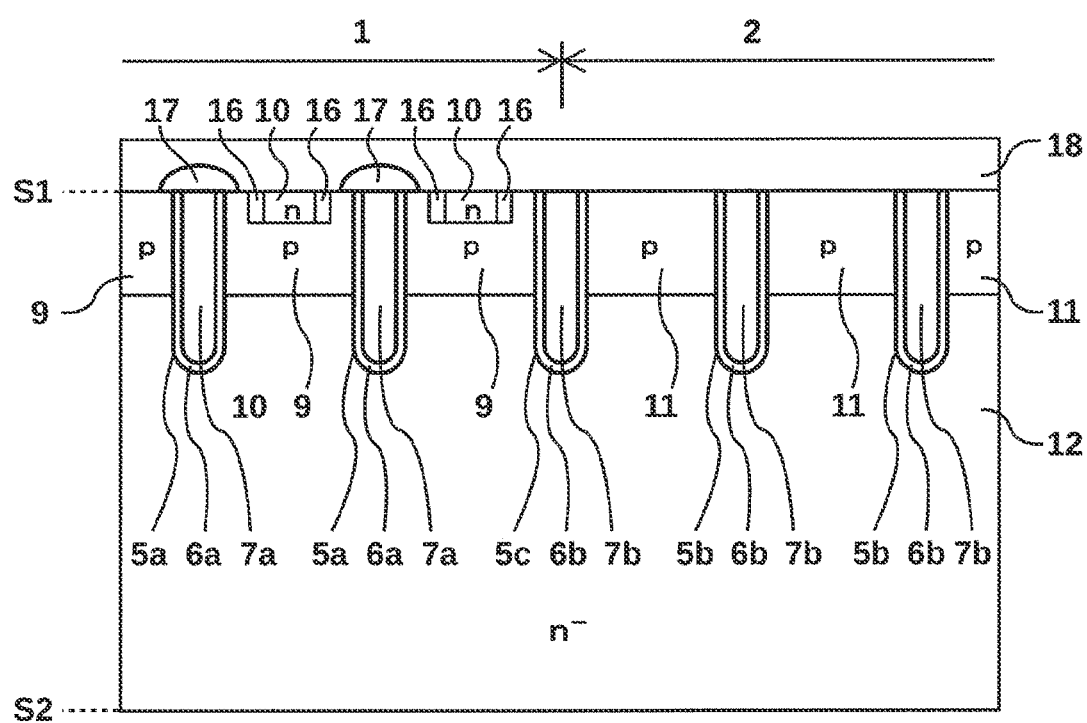
FIG. 9 is a diagram illustrating a manufacturing process for the semiconductor device according to Embodiment 1.

FIG. 9 is a diagram illustrating a state in which the first electrode forming step is completed. The first electrode forming step is a step of forming the first electrode 18. The first electrode 18 is formed by sputtering a metal from, for example, the first main surface S1 side. For example, aluminum is used as the metal. By sputtering, the first electrode 18 covering the interlayer insulating film 17 and the first main surface S1 is formed.

Figure 10A:
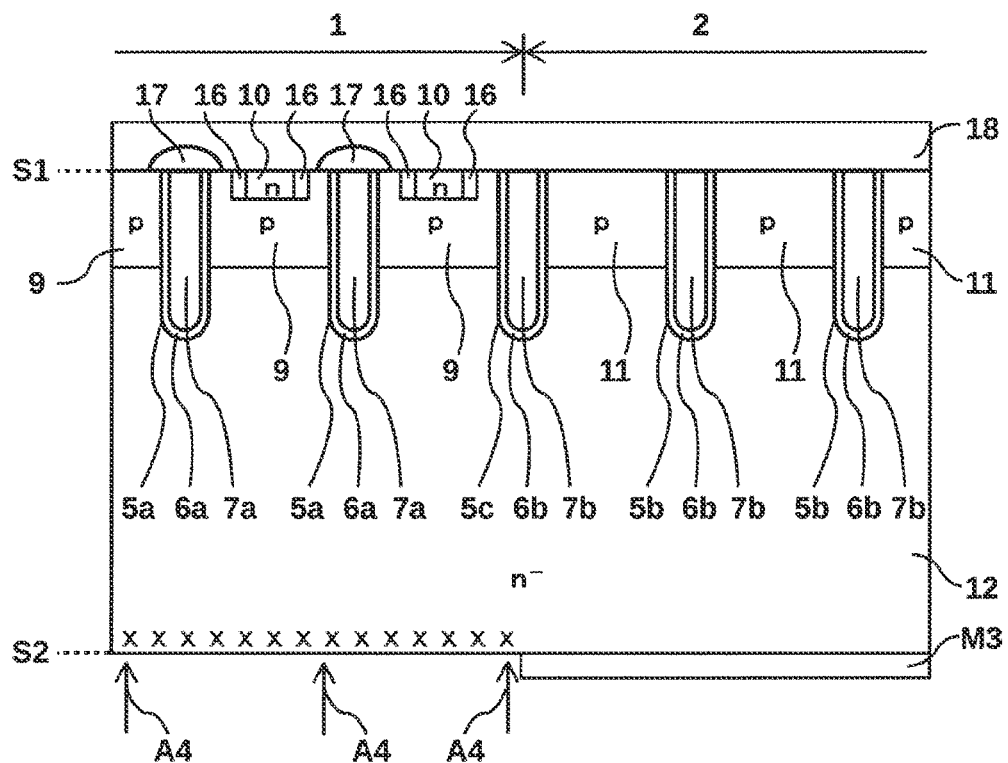
FIGS. 10A and 10B are diagrams illustrating manufacturing processes for the semiconductor device according to Embodiment 1.
Figure 10B:
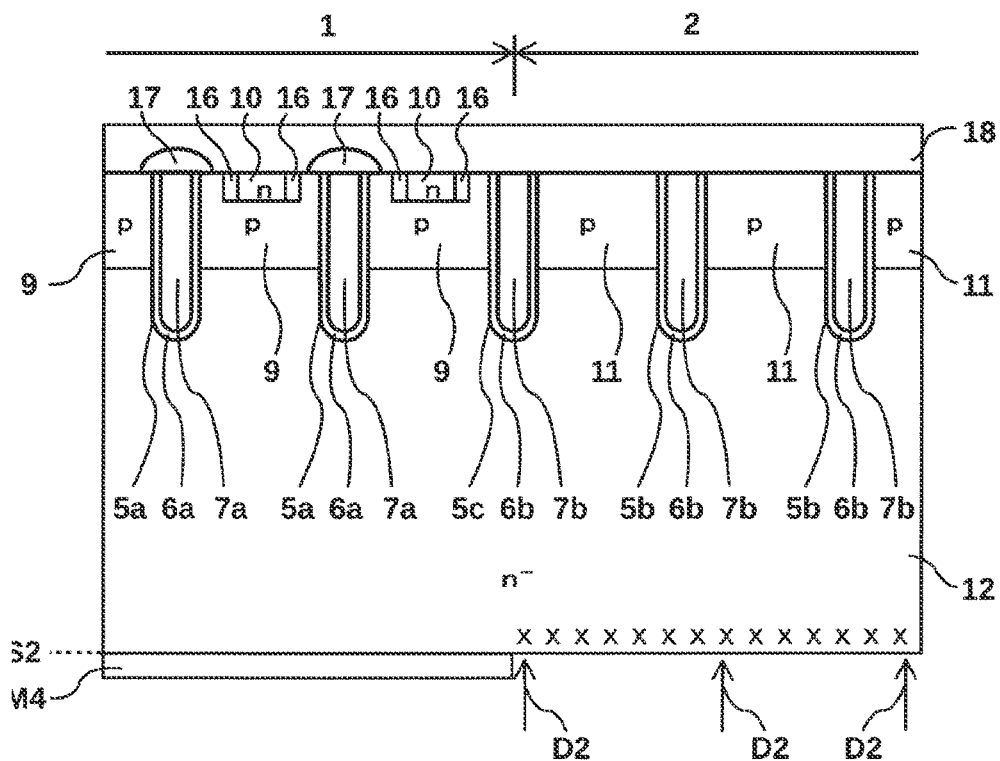

FIGS. 10A and 10B are diagrams illustrating the manufacturing processes of the second main surface side semiconductor layer forming step.

FIG. 10A is a diagram illustrating a manufacturing process of the second main surface side p-type semiconductor layer forming step. The second main surface side p-type semiconductor layer forming step is a step of forming the collector layer 13. The collector layer 13 is formed by implanting acceptor atoms A4 from the second main surface S2 side. As the acceptor atoms A4, for example, boron, aluminum or the like is used. The acceptor atoms A4 of the collector layer 13 can be the same as one or more of the acceptor atoms A1 of the base layer 9, the acceptor atoms A2 of the anode layer 11, and the acceptor atoms A3 of the base contact layer 16. When the acceptor atoms are the same, the switching operation of the acceptor atoms can be reduced. A mask M3 for implanting the acceptor atoms on the second main surface side may be used on the second main surface S2 of the diode region 2 in which the acceptor A4 is not implanted. The mask M3 for implanting the acceptor atoms on the second main surface side is formed by applying a resist on the second main surface S2, for example, and is removed after implanting the acceptor atoms A4. The implanted acceptor atoms A4 are diffused by heating to form the collector layer 13.

FIG. 10B is a diagram illustrating a manufacturing process of the second main surface side n-type semiconductor layer forming step. The second main surface side n-type semiconductor layer forming step is a step of forming the cathode layer 15. The cathode layer 15 is formed by implanting donors D2 from the second main surface S2 side. As the donors D2, arsenic, phosphorus or the like is used. The donors 132 of the cathode layer 15 can be the same as one or both of the donors of the emitter layer 8 and the donors of the counter-doped layer 10, and when the donors are the same, the switching operation of the donors can be reduced.

A mask M4 for implanting the donors on the second main surface side may be used on the second main surface S2 of the insulated gate bipolar transistor region 1 in which donors D2 are not implanted. The mask M4 for implanting the donors on the second main surface side is formed by applying a resist on the second main surface S2, for example, and is removed after implanting the donors D2. The implanted donors D2 are diffused by heating to form the cathode layer 15. Although, the cathode layer 15 is formed after the collector layer 13 is formed, the order of formation is not limited thereto. The collector layer 13 may be formed after the cathode layer 15 is formed. In addition, the acceptor atoms A3 and the donors D2 may be simultaneously heated and diffused.

The second electrode forming step (not illustrated) is a step of forming the second electrode 19. The second electrode 19 is formed by sputtering a metal from, for example, the second main surface S2 side. For example, aluminum is used as the metal. By sputtering, the second electrode 19 covering the second main surface S2 is formed. Through the above steps, the semiconductor device 100 illustrated in FIG. 1 is obtained.

Figure 11:
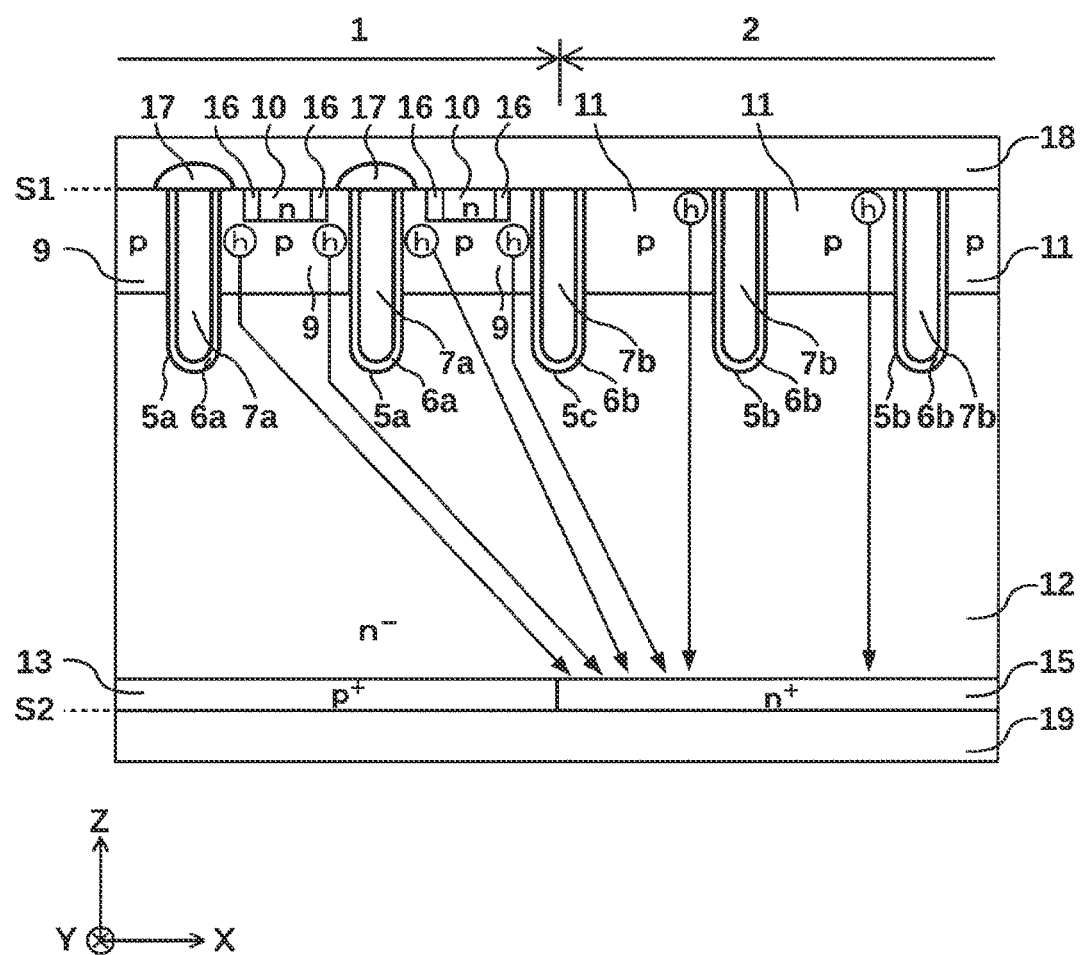
FIG. 11 is a schematic diagram illustrating the movement of holes during diode operation of the semiconductor device according to Embodiment 1.

The diode operation of the semiconductor device according to Embodiment 1 will be described. FIG. 11 is a schematic diagram illustrating the movement of holes during diode operation of the semiconductor device according to Embodiment 1. FIG. 11 is a diagram schematically illustrating the movement of holes during diode operation in the cross-sectional view taken along the line C-C in FIG. 2. During diode operation, a positive voltage is applied to the first electrode 18 compared to that is applied to the second electrode 19. When a positive voltage is applied, holes h are implanted into the drift layer 12 from the anode layer 11, the base layer 9, and the base contact layer 16 which are p-type semiconductor layers, and the implanted holes h migrate toward the cathode layer 15. In the diode region 2 near the boundary with the insulated gate bipolar transistor region 1, the density of the holes h is higher than that of the diode region 2 which is away from the insulated gate bipolar transistor region 1, because in addition to the holes h from the anode layer 11, the holes h migrate in from the insulated gate bipolar transistor region 1. During diode operation, a reflux current flows in the direction from the first electrode 18 toward the second electrode 19.

The recovery operation of the semiconductor device according to Embodiment 1 will be described. FIG. 12 is a schematic diagram illustrating the movement of boles during recovery operation of the semiconductor device according to Embodiment 1. FIG. 12 is a diagram schematically illustrating the movement of holes during recovery operation in the cross-sectional view taken along the line C-C in FIG. 2. During recovery operation, a negative voltage is applied to the first electrode 18 compared to that is applied to the second electrode 19. The holes h migrating toward the cathode layer 15 during the diode operation, change the moving direction and migrate toward the anode layer 11. During recovery operation, the holes h flow out to the outside of the semiconductor device via the anode layer 11 and the first electrode 18.

In the anode layer 11 in the diode region 2 near the boundary with the insulated gate bipolar transistor region 1 having a high density of holes h during diode operation, more holes h pass therethrough than that pass through the anode layer 11 in the diode region 2 away from the insulated gate bipolar transistor region 1. Further, some of the holes h presenting in the insulated gate bipolar transistor region 1 flow out to the outside of the semiconductor device via the base layer 9, the base contact layer 16, and the first electrode 18. During recovery operation, a recovery current flows in the direction from the second electrode 19 toward the first electrode 18.

The effect of the suppression of hole implantation in the semiconductor device according to Embodiment 1 will be described with reference to FIG. 11.

The semiconductor device according to Embodiment 1 suppresses the holes h from flowing into the diode region 2 from the insulated gate bipolar transistor region 1. As illustrated in FIG. 11, the holes h are implanted from the p-type base layer 9 and the p-type base contact layer 16 into the drift layer 12 in the diode region 2 during diode operation. On the other hand, the holes h are not implanted from the n-type counter-doped layer 10 into the drift layer 12 in the diode region 2. Therefore, with the counter-doped layer 10 provided, the implantation of the holes h from the insulated gate bipolar transistor region 1 to the diode region 2 during diode operation is suppressed more than with the case where no counter-doped layer 10 is provided.

Therefore, by selectively providing the counter-doped layer 10 in the surface layer of the base layer 9, improvement in the fracture resistance during the recovery operation is ensured with the recovery current suppressed. Further, the concentration of acceptor impurities in the surface layer of the counter-doped layer 10 is higher than that of the anode layer 9. Accordingly, the electrical contact resistance between the first electrode 18 and the counter-doped layer 10 can be made lower than the electrical contact resistance between the first electrode 18 and the anode layer 9.

Further, in the semiconductor device according to Embodiment 1, as illustrated in FIG. 2, the width W2 of the counter-doped layer 10 in the X direction is narrower than the width W1 of the emitter layer 8 in the Y direction. By setting the width W2 of the counter-doped layer 10 as described, the voltage drop that occurs at the interface between the counter-doped layer 10 and the base layer 9 can be made less than or equal to the voltage drop that occurs at the interface between the emitter layer 8 and the base layer 9, and the latch-up resistance at the junction between the counter-doped layer 10 and the base layer 9 can be made higher than the latch-up resistance at the junction between the emitter layer 8 and the base layer 9.

Although, the structure in which the gate electrodes 7a are arranged in all trenches 5a is illustrated in Embodiment 1, the gate electrodes 7a are not necessarily arranged in all trenches 5a of the insulated gate bipolar transistor region 1 when the amount of heat generated per unit area of the insulated gate bipolar transistor region 1 when energized is large. And a structure referred to as so-called thinning structure or the like is also adoptable in which, the gate electrodes 7b electrically connected to the first electrode 18 are arranged in some of the trenches of the plurality of trenches arranged in the insulated gate bipolar transistor region 1.

Further, although the structure in which the gate electrode 7b is arranged in the trench 5c located at the boundary between the insulated gate bipolar transistor region 1 and the diode region 2 is illustrated, a structure in which the gate electrode 7a electrically connected to the gate signal reception region 3 is provided in the trench 5c is also adoptable.

Embodiment 2

Figure 13:
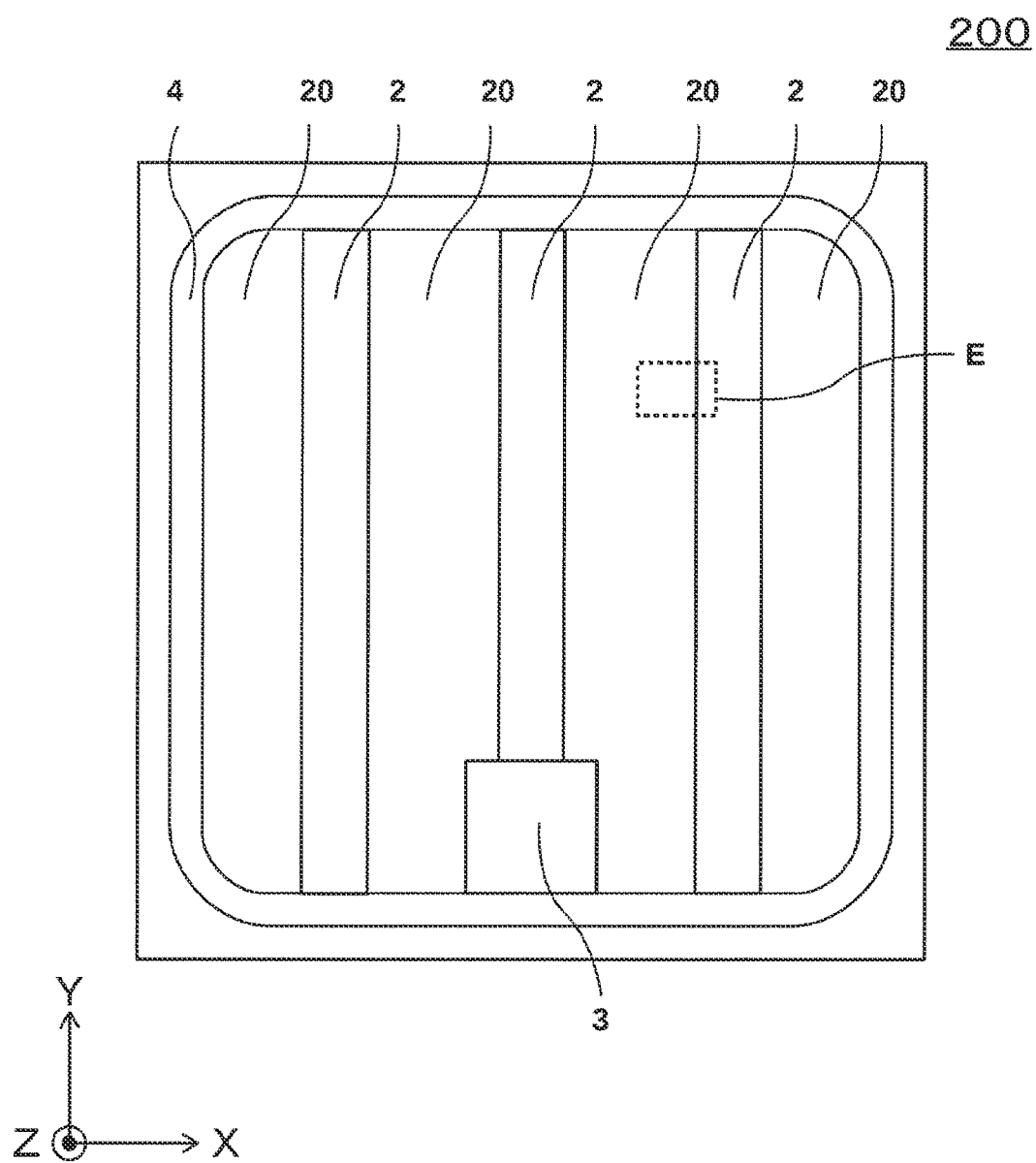
FIG. 13 is a plan view illustrating a semiconductor device according to Embodiment 2.
Figure 14:
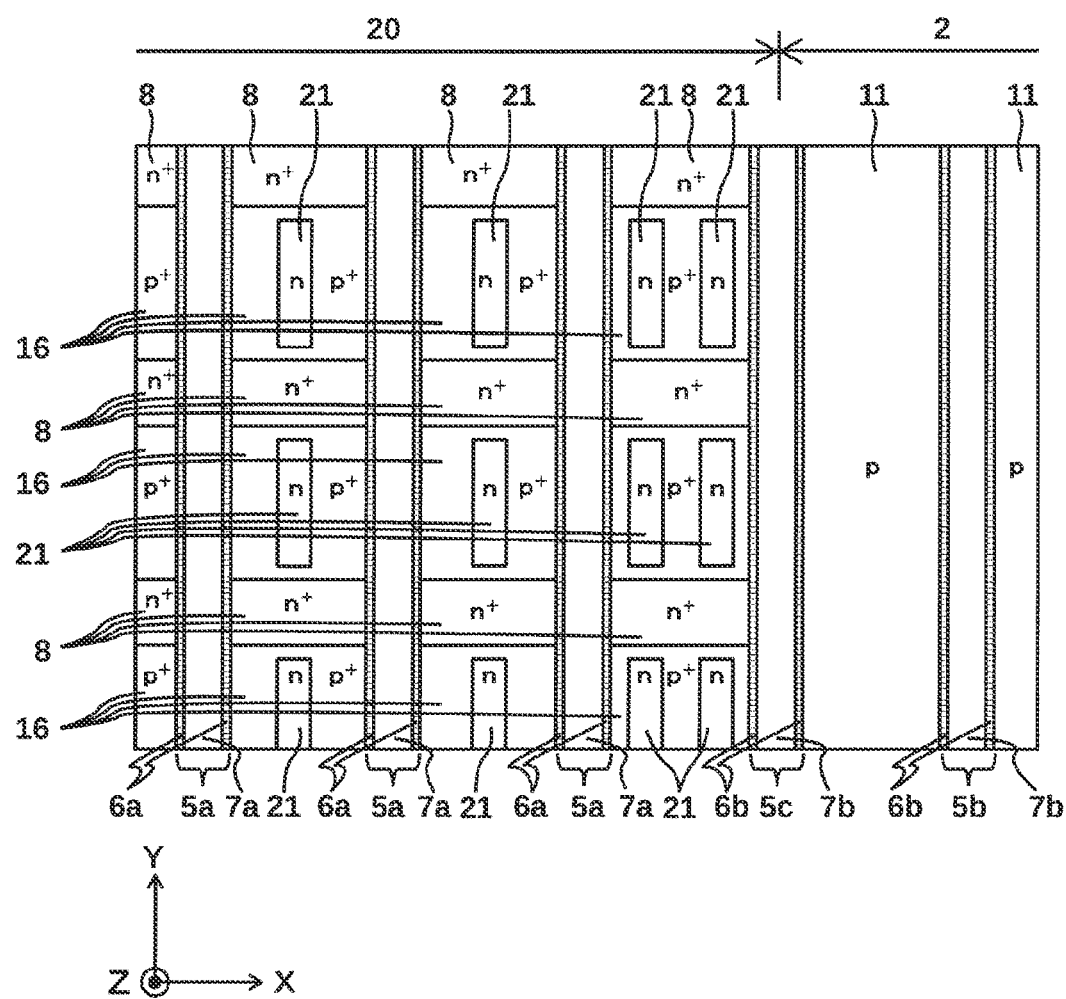
FIG. 14 is a plan view illustrating the semiconductor device according to Embodiment 2.

The configuration of the semiconductor device according to Embodiment 2 will be described with reference to FIGS. 13 and 14. FIGS. 13 and 14 are plan views illustrating the semiconductor device according to Embodiment 2. FIG. 14 is an enlarged view of the part E illustrated in FIG. 13, and is a plan view illustrating the structure of the semiconductor substrate on the first main surface side. In FIG. 14, the description of electrodes and the like provided above the first main surface of the semiconductor substrate is omitted. For convenience in description, the XYZ orthogonal coordinate axes indicating directions is illustrated in FIGS. 13 and 14. In Embodiment 2, the same components as those described in Embodiment 1 are designated by the same reference numerals, and the description thereof will be omitted.

As illustrated in FIG. 13, in a semiconductor device 200 according to Embodiment 2, insulated gate bipolar transistor regions 20 and the diode regions 2 are repeatedly provided in the X direction of the semiconductor device 200.

As illustrated in FIG. 14, in the semiconductor device according to Embodiment 2, a structure is adopted in which the ratio of the areas where the counter-doped layers 21 between the adjacent gate electrodes 7a or the areas where the counter-doped layers 21 between adjacent gate electrode 7a and the gate electrode 7b are arranged in plan view becomes greater as closer to the diode region 2. Further, the base contact layer 16 is arranged in the surface layer of the semiconductor substrate so that the base layer is not exposed.

In FIG. 14, each of all the plurality of counter-doped layers 21 has the same area. In plan view, in the insulated gate type bipolar transistor region 20, when comparing the ratio of the areas in which the counter-doped layers 21 between the adjacent gate electrodes 7a are arranged or the ratio of the areas in which the counter-doped layers 21 between the gate electrode 7a and the gate electrode 7b are arranged, the ratio of the areas in which the counter-doped layers 21 between the gate electrode 7a and the gate electrode 7b which is closest to the diode region 2 is twice as the ratio of the areas of the counter-doped layers 21 between the adjacent gate electrodes 7a.

Typically, the closer to the diode region, the more holes flowing into the diode region from the insulated gate bipolar transistor region into the diode region during recovery operation.

In the semiconductor device according to Embodiment 2, by setting the ratio of the areas in which the counter-doped layers 21 between the adjacent gate electrodes 7a are arranged or the ratio of the areas in which the counter-doped layers 21 between the gate electrode 7a and the gate electrode 7b are arranged higher as closer to the diode region 2, more efficient suppression of the holes from the insulated gate bipolar transistor region 20 toward the diode region 2 and the improvement in fracture resistance during recovery operation are ensured. Meanwhile, in the insulated gate bipolar transistor region 20 away from the diode region 2, the risk of occurring latch-up directly under the counter-doped layer 21 can be suppressed when it is switched to the non-energized state.

Further, the counter-doped layer 21 is interposed between the base contact layers 16 and is not in contact with the gate insulating film 6a. The counter-doped layer 21 is a semiconductor layer that is not involved in switching between the energized state and the non-energized state of the insulated gate bipolar transistor region 20. Therefore when the structure is adopted in which the ratio of the areas where the counter-doped layers 21 between the adjacent gate electrodes 7a or the areas where the counter-doped layers 21 between adjacent gate electrode 7a and the gate electrode 7b in plan view becomes greater as closer to the diode region 2, current balance in the insulated gate bipolar transistor region 20 is suppressed from being deteriorated.

In Embodiment 2, an example has been described in which, it is assumed that each of the plurality of counter-doped layers 21 as the same area, the number of counter-doped layers 21 arranged between adjacent gate electrodes 7a or between the gate electrode 7a and the gate electrode 7b is increased as closer to the diode region 2 so as to make the ratio of the areas in which the counter-doped layers 21 between the adjacent gate electrodes 7a or between the gate electrode 7a and the gate electrode 7b are arranged is greater as closer to the diode region 2. However, a structure may also be adoptable in which the numbers of the counter-doped layers 21 between the adjacent gate electrodes 7a, or between the gate electrode 7a and the gate electrode 7b are set to equal, and the areas of the counter-doped-layers 21 are made larger as closer to the diode region 2, thereby making the ratio of the area where the counter-doped layers 21 are arranged between the adjacent gate electrodes 7a or between the gate electrode 7a and the gate electrode 7b each other greater as closer to the diode region 2.

Further, in Embodiment 2, the base contact layer 16 is arranged in the surface layer of the semiconductor substrate, and the base layer is not exposed. In order to build such a structure, the base contact layer 16 may be provided by implanting acceptor atoms into a portion where the base layer is exposed. The base contact layer 16 is a semiconductor layer having a higher acceptor concentration than that of the base layer and from which more holes are implanted into the diode region 2, while the electrical contact resistance with the emitter electrode is lower than that of the base layer. Due to both the counter-doped layer 21 and the base contact layer 16 being semiconductor layer having low electric contact resistance with the emitter electrode, the semiconductor device of Embodiment 2 is a semiconductor device in which the electric contact resistance between the emitter electrode and the semiconductor substrate in the insulated gate bipolar transistor region can be lowered further than that by the semiconductor device of Embodiment 1.

Embodiment 3

Figure 15:
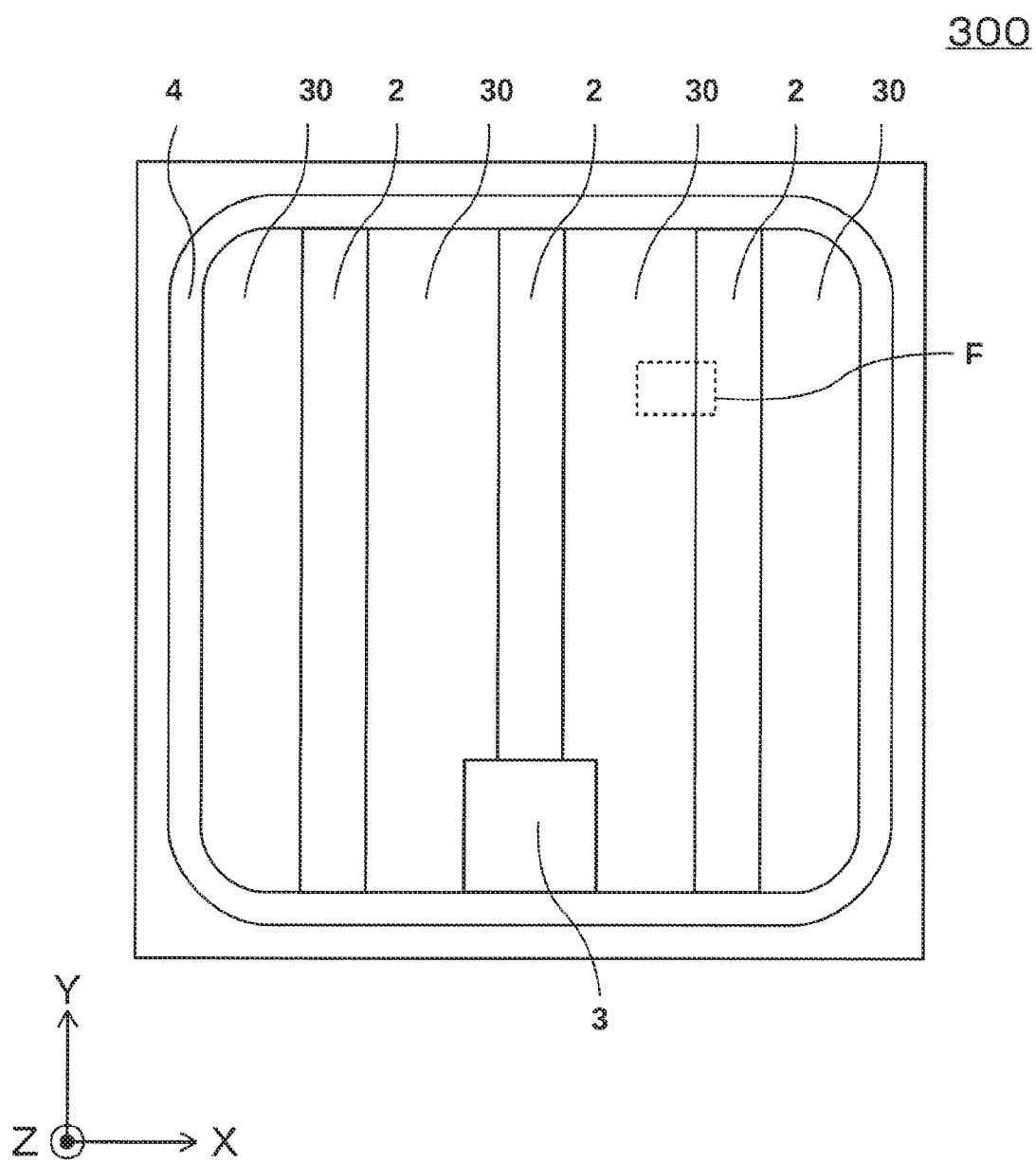
FIG. 15 is a plan view illustrating a semiconductor device according to Embodiment 3.
Figure 16:
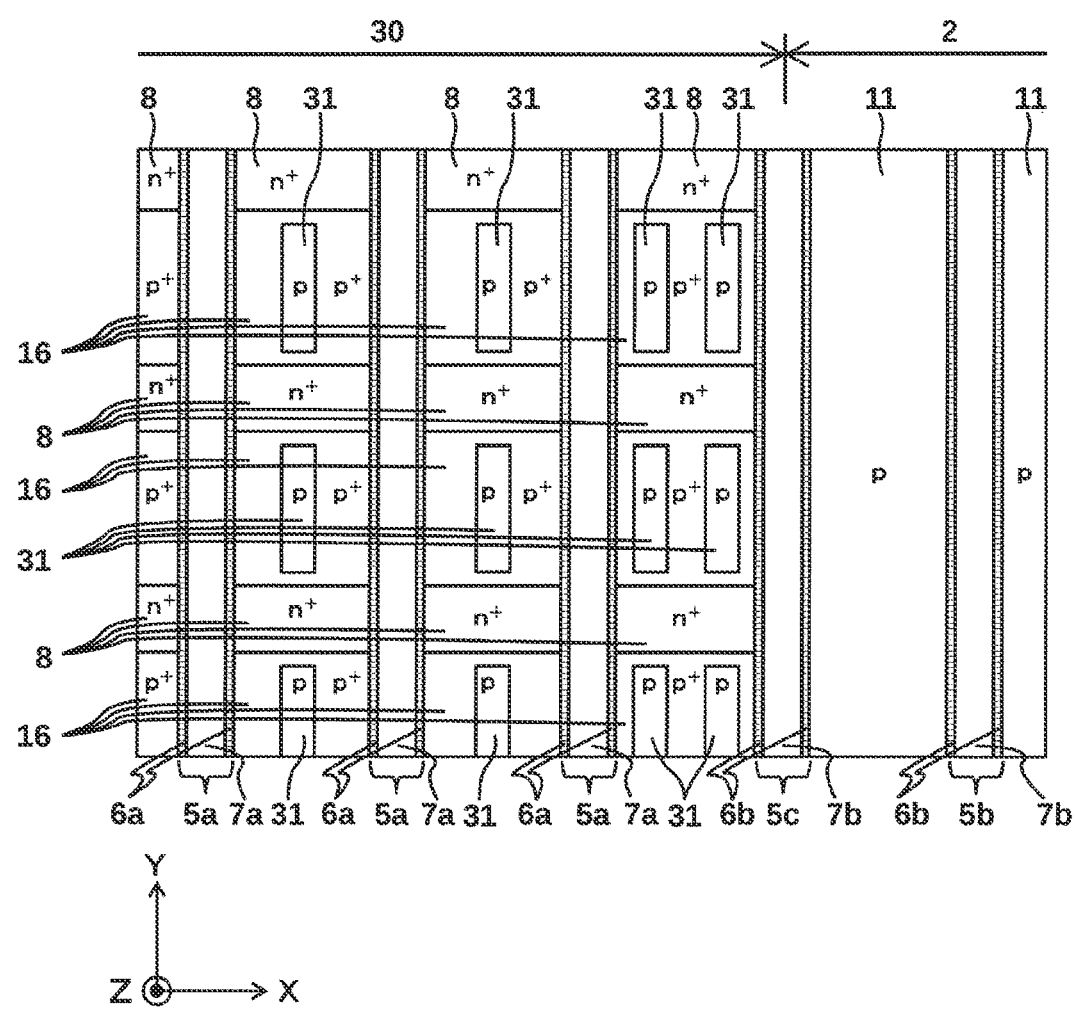
FIG. 16 is a plan view illustrating the semiconductor device according to Embodiment 3.

The configuration of the semiconductor device according to Embodiment 3 will be described with reference to FIGS. 15 and 16. FIGS. 15 and 16 are plan views illustrating the semiconductor device according to Embodiment 3. FIG. 16 is an enlarged view of the part F illustrated in FIG. 15, and is a plan view illustrating the structure of the semiconductor substrate on the first main surface side. In FIG. 16, the illustration of electrodes and the like provided above the first main surface of the semiconductor substrate is omitted. For convenience in description, the XYZ orthogonal coordinate axes indicating directions illustrated in FIGS. 15 and 16. In Embodiment 3, the same components as those described in Embodiments 1 and 2 are designated by the same reference numerals and the description thereof will be omitted.

As illustrated in FIG. 15, in a semiconductor device 300 according to Embodiment 3, insulated gate bipolar transistor regions 30 and the diode regions 2 are repeatedly provided in the X direction of the semiconductor device 300.

As illustrated in FIG. 16, the semiconductor device according to Embodiment 3 is a semiconductor layer in which the net doping concentration of the surface layer of the counter-doped layer 31 is p-type. In order to make the net doping concentration of the surface layer of the counter-doping layer 31 p-type, impurities need only be implanted so that the acceptor impurity concentration of the surface layer of the counter-doping layer 31 is higher than the donor impurity concentration.

In the semiconductor device according to Embodiment 3, suppression of occurrence of the risk of latch-up in the insulated gate bipolar transistor region 30 is ensured.

Further, the counter-doped layer 31 is p-type whose net doping concentration is lower than that of the base contact layer 16 being p-type as well. Therefore, from the counter-doped layer 31, fewer holes are implanted into the diode region 2 than from the base contact layer 16.

In Embodiment 3, by setting the ratio of the areas in which the counter-doped layers 31 between the adjacent gate electrodes 7a are arranged or the ratio of the areas in which the counter-doped layer 31 between the gate electrode 7a and the gate electrode 7b are arranged higher as closer to the diode region 2, more efficient suppression of the holes from the insulated gate bipolar transistor region 30 toward the diode region 2 and the improvement in latch-up fracture resistance of the insulated gate bipolar transistor region are ensured.

Embodiment 4

Figure 17:
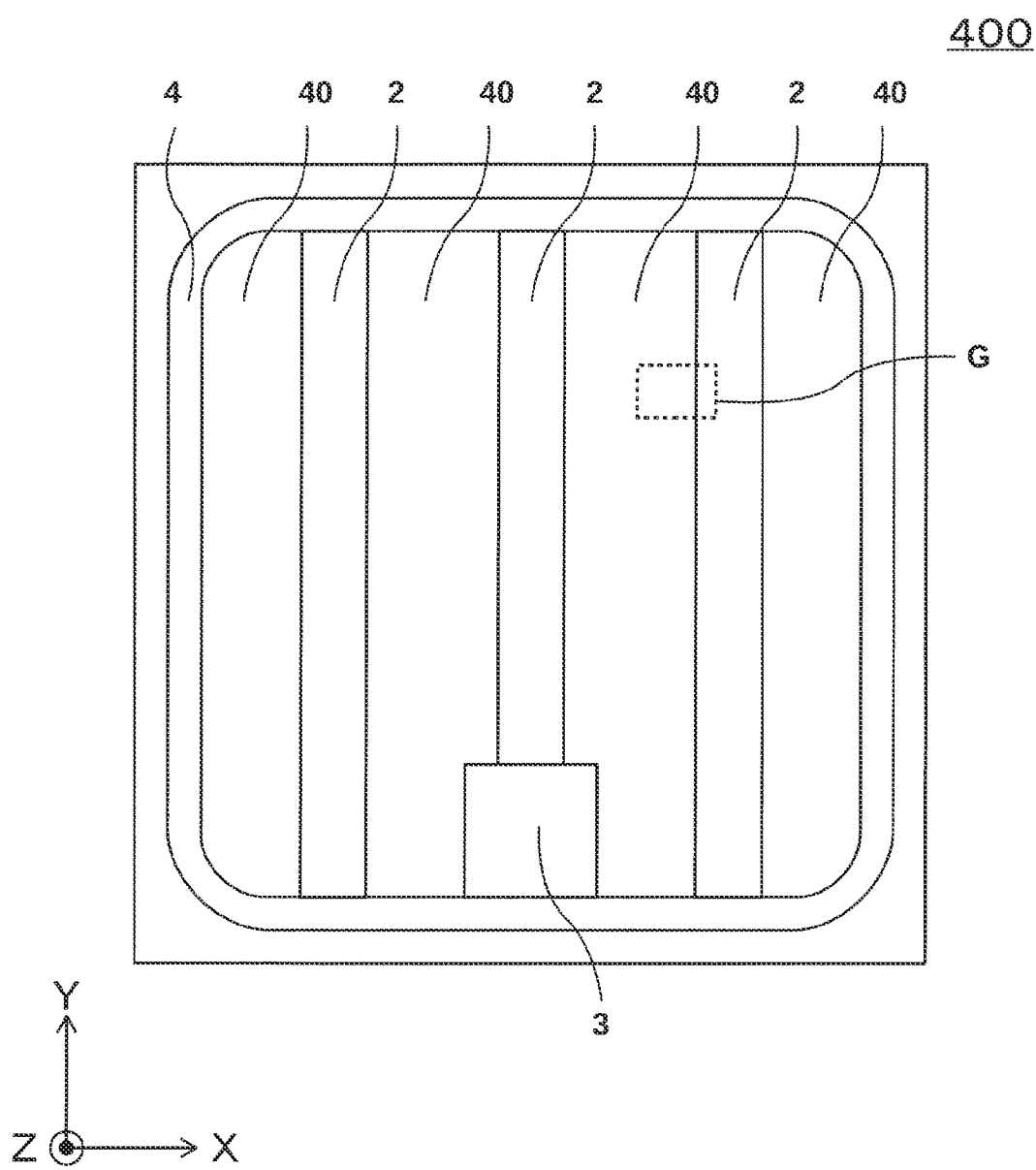
FIG. 17 is a plan view illustrating a semiconductor device according to Embodiment 4.
Figure 18:
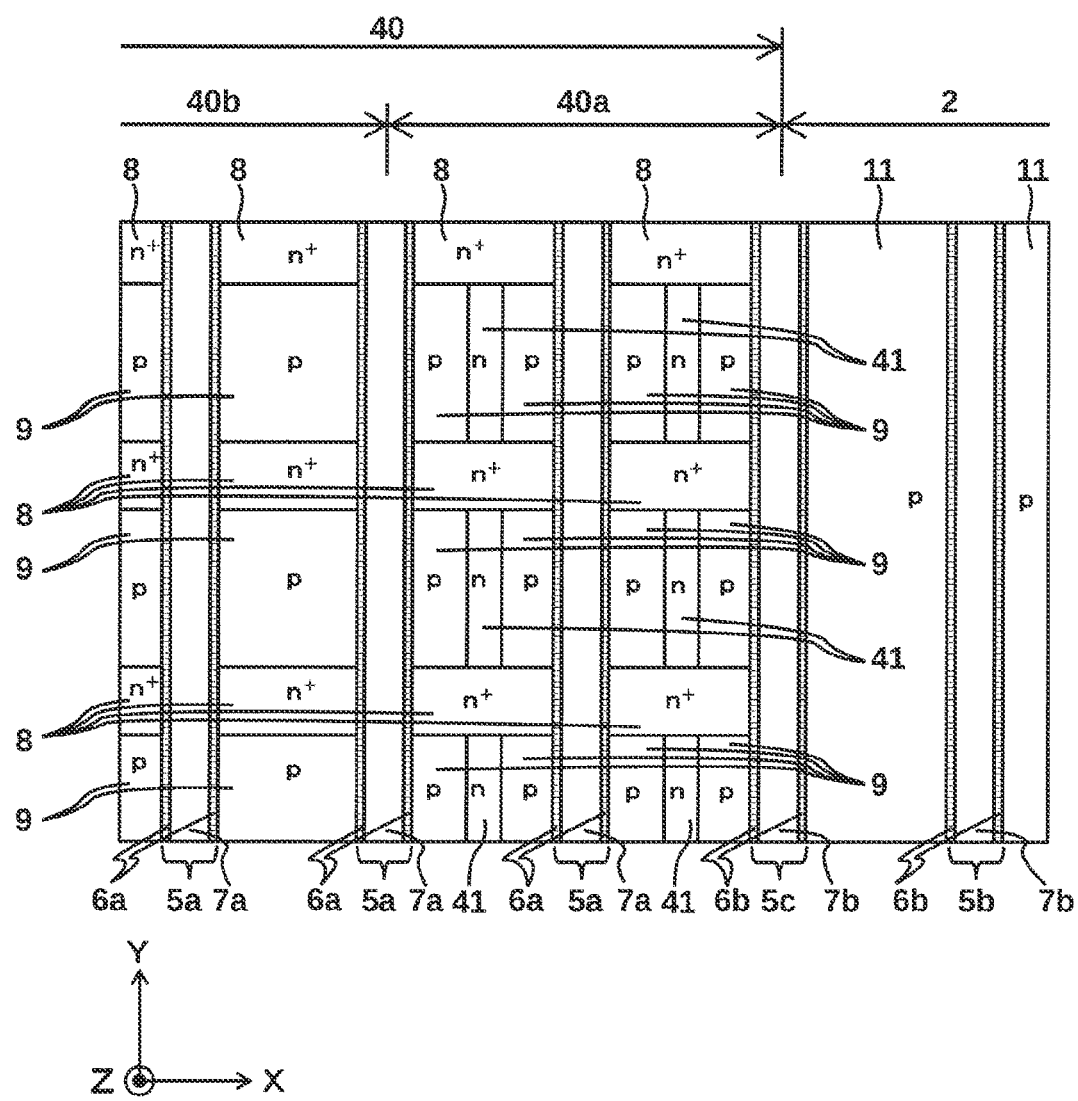
FIG. 18 is a plan view illustrating the semiconductor device according to Embodiment 4.

The configuration of the semiconductor device according to Embodiment 3 will be described with reference to FIGS. 17 and 18. FIGS. 17 and 18 are plan views illustrating the semiconductor device according to Embodiment 4. FIG. 18 is an enlarged view of the part G illustrated in FIG. 17, and is a plan view illustrating the structure of the semiconductor substrate on the first main surface side. In FIG. 18, the illustration of electrodes and the like provided above the first main surface of the semiconductor substrate is omitted. For convenience in description, the XYZ orthogonal coordinate axes indicating directions is illustrated in FIGS. 17 and 18. In Embodiment 4, the same components as those described in Embodiments 1 to 3 are designated by the same reference numerals and the description thereof will be omitted.

As illustrated in FIG. 17, in a semiconductor device 400 according to Embodiment 4, insulated gate bipolar transistor regions 40 and the diode regions 2 are repeatedly provided in the X direction of the semiconductor device 400.

As illustrated in FIG. 18, in a semiconductor device 400 according to Embodiment 4 includes an insulated gate bipolar transistor region 40. The insulated gate bipolar transistor region 40 includes a first region 40a in which counter-doped layers 41 are provided between the adjacent gate electrodes 7a or the adjacent gate electrodes 7a and 7b and a second region 40b in which no counter-doped layer 41 is provided between the adjacent gate electrodes 7a or the adjacent gate electrodes 7a and 7b. The first region 40a is arranged closer to the diode region 2 than the second region 40b.

The semiconductor device according to Embodiment 4, the first region 40a in which the counter-doped layers 41 are provided is arranged closer to the diode region 2 than the second region 40b in which no counter-doped layer 41 is provided, thereby, more efficient suppression of the holes from the insulated gate bipolar transistor region toward the diode region 2 and the improvement in fracture resistance during recovery operation are ensured. Meanwhile, in the insulated gate bipolar transistor 40, the second region 40b is arranged further away from the first region 40a, and no counter-doped layer 41 is provided in the second region 40b, thereby, the risk of occurring latch-up can be suppressed when the insulated gate bipolar transistor region 40 is switched to the non-energized state.

Further, the counter-doped layer 41 is in contact with the emitter layer 8 in the Y direction. Such a structure allows to increase the areas of the counter-doped layers 41 and suppress the holes from flowing into the diode region 2, improving the fracture resistance during recovery operation.

The semiconductor device according to Embodiment 4 has a structure in which a base contact layer is not provided in the surface layer on the first main surface side of the semiconductor substrate, unlike the semiconductor devices of Embodiments 1 to 3. In order to build such a structure, the implantation region of the donor layer forming the counter-doped layer need only be wider than the implantation region for the acceptor atoms forming the base contact layer, or respective impurities need only be implanted into the regions of the same size. When the implantation region of the donor layer forming the counter-doped layer is wider than the implantation region of the acceptor atoms forming the base contact layer, a structure to be adopted is that the counter-doped layer is covered with the n-type semiconductor layer in a plan view. By adopting a structure in which the n-type semiconductor layer does not contact the gate insulating film of the active gate electrode, current balance in the insulated gate bipolar transistor region is suppressed from being deteriorated. The adoption of the structure in which no base contact layer is provided in the surface layer on the first main surface side of the semiconductor substrate ensures the further suppression of the inflow of holes into the diode region.

In Embodiments 1 to 4, although the structure in which the anode layer is a single layer is illustrated, the structure is not limited thereto, and a structure in which the anode layer may include two layers composed of the same conductive type may also be adoptable. For example, when the contact resistance at the contact portion between the anode layer and the first electrode is high, the contact resistance at the contact portion between the anode layer and the first electrode can be lowered by adopting a double layer structure in which a high concentration anode layer having a high impurity concentration is provided on the first main surface side, and a low concentration anode layer having a lower impurity concentration than that of the high concentration anode layer is provided on the second surface side closer than the high concentration anode layer.

Although Embodiments of the present disclosure have been described, these are presented as examples. Various omissions, replacements, and changes can be made without departing from the scope of the present disclosure. Each Embodiment can also be combined.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a semiconductor substrate having a drift layer of a first conductivity type between a first main surface and a second main surface opposite to the first main surface;
a diode region having an anode layer of a second conductivity type provided in a surface layer of the semiconductor substrate on the first main surface side and a cathode layer of the first conductivity type provided in a surface layer of the semiconductor substrate on the second main surface side;
an insulated gate bipolar transistor region arranged in line with the diode region along the first main surface of the semiconductor substrate in a first direction having a base layer of the second conductivity type provided in the surface layer of the semiconductor substrate on the first main surface side, an emitter layer of the first conductivity type having an impurity concentration higher than that of the drift layer selectively provided in a surface layer of the base layer on the first main surface side, a plurality of gate electrodes arranged side by side in the first direction and facing the emitter layer, the base layer, and the drift layer via gate insulating films, a counter-doped layer provided in a surface layer of the base layer, having an impurity concentration of the second conductivity type higher than that of the base layer and an impurity concentration of the first conductivity type higher than that of the drift layer, and a collector layer of the second conductivity type provided in the surface layer of the semiconductor substrate on the second main surface side, wherein
each of the counter-doped layer and the emitter layer has a longitudinal direction and a lateral direction orthogonal to the longitudinal direction in plan view, and
a maximum width of the lateral direction of the counter-doped layer is narrower than a width of the lateral direction of the emitter layer.

2. The semiconductor device according to claim 1, wherein
the counter-doped layer is arranged interposed between the base layers between the adjacent gate electrodes in the first direction.

3. The semiconductor device according to claim 1, further comprising a base contact layer of the second conductivity type, provided in the surface layer of the base layer and having an impurity concentration higher than that of the base layer, wherein
the counter-doped layer is arranged interposed between the base contact layers between the adjacent gate electrodes in the first direction.

4. The semiconductor device according to claim 3, wherein
impurities for the second conductivity type of the counter-doped layer are a same as impurities of the second conductivity type of the base contact layer.

5. The semiconductor device according to claim 1, wherein
impurities for the first conductivity type of the counter-doped layer are the same as impurities of the first conductivity type of the emitter layer.

6. The semiconductor device according to claim 1, wherein
an impurity concentration of the first conductivity type in the counter-doped layer is higher than an impurity concentration of the second conductivity type in the counter-doped layer.

7. The semiconductor device according to claim 1, wherein
an impurity concentration of the first conductivity type in the counter-doped layer is lower than an impurity concentration of the second conductivity type in the counter-doped layer.

8. The semiconductor device according to claim 1, wherein
the counter-doped layer is in contact with the emitter layer in a third direction orthogonal to the first and second directions.

9. The semiconductor device according to claim 1, wherein
the insulated gate bipolar transistor region has a first region in which the counter-doped layer is provided between the adjacent gate electrodes and a second region being adjacent to the first region in which the counter-doped layer is provided so as to have a larger area ratio than the first region, and
the first region is closer to the diode region than the second region.

10. The semiconductor device according to claim 1, wherein
the insulated gate bipolar transistor region has a third region in which the counter-doped layer is provided between the adjacent gate electrodes and a fourth region in which the counter-doped layer is not provided between the adjacent gate electrodes, and
the third region is closer to the diode region than the fourth region.

11. The semiconductor device according to claim 1, wherein
the diode region has
a high impurity concentration anode layer provided in the surface layer on the first main surface, and
a low impurity concentration anode layer provided closer to the second main surface side than the high impurity concentration anode layer and having an impurity concentration lower than that of the high impurity concentration anode layer.

* * * * *